United States Patent
Reynolds et al.

(10) Patent No.: US 8,607,529 B2
(45) Date of Patent: Dec. 17, 2013

(54) MINI-TRUSS THIN-SHEET PANEL ASSEMBLY

(71) Applicant: Gossamer Space Frames, Huntington Beach, CA (US)

(72) Inventors: Glenn Alan Reynolds, Laguna Hills, CA (US); Dean Robert Hackbarth, Las Vegas, NV (US); Gary Noble Curtis, Anacortes, WA (US)

(73) Assignee: Gossamer Space Frames, Huntington Beach, CA (US)

( * ) Notice: Subject to any disclaimer, the term of this patent is extended or adjusted under 35 U.S.C. 154(b) by 0 days.

(21) Appl. No.: 13/709,384

(22) Filed: Dec. 10, 2012

(65) Prior Publication Data

US 2013/0161471 A1 Jun. 27, 2013

Related U.S. Application Data

(63) Continuation of application No. 12/254,795, filed on Oct. 20, 2008, now Pat. No. 8,327,604.

(60) Provisional application No. 60/999,833, filed on Oct. 18, 2007.

(51) Int. Cl.
| E04B 1/18 | (2006.01) |
| E04B 5/10 | (2006.01) |
| E04B 5/18 | (2006.01) |

(52) U.S. Cl.
USPC .............................. 52/746.1; 52/633; 52/639

(58) Field of Classification Search
USPC ............................ 52/783.1, 783.11, 633–639
See application file for complete search history.

(56) References Cited

U.S. PATENT DOCUMENTS

| 963,889 | A | * | 7/1910 | Goodwin | 52/181 |
| 1,433,232 | A | * | 10/1922 | Rogers | 52/443 |
| 1,576,559 | A | * | 3/1926 | Swift | 52/791.1 |
| 2,391,997 | A | * | 1/1946 | Noble | 52/578 |
| 2,792,164 | A | * | 5/1957 | Cauffiel | 182/194 |
| 2,990,038 | A | * | 6/1961 | Diamond | 52/636 |
| 3,008,551 | A | * | 11/1961 | Cole | 428/132 |
| 3,046,638 | A | * | 7/1962 | Melzer | 29/897.32 |
| 3,050,831 | A | * | 8/1962 | Diamond | 29/897.31 |
| 3,111,204 | A | * | 11/1963 | Phare | 52/635 |
| 3,266,790 | A | * | 8/1966 | Bradeen | 267/163 |
| 3,380,217 | A | * | 4/1968 | Mikus | 52/630 |
| 3,392,500 | A | * | 7/1968 | Johnston | 52/783.15 |
| 3,415,027 | A | * | 12/1968 | Bradley et al. | 52/263 |
| 3,507,634 | A | * | 4/1970 | O'Driscoll | 428/573 |
| 3,525,663 | A | * | 8/1970 | Hale | 428/179 |
| 3,673,057 | A | * | 6/1972 | Fairbanks | 428/116 |
| 3,793,791 | A | * | 2/1974 | Wootten | 52/789.1 |
| 3,834,487 | A | * | 9/1974 | Hale | 181/292 |
| 4,087,302 | A | * | 5/1978 | Wootten | 156/204 |

(Continued)

*Primary Examiner* — Mark Wendell
(74) *Attorney, Agent, or Firm* — Blue Capital Law Firm, P.C.

(57) ABSTRACT

A mini-truss thin-sheet panel assembly, in one embodiment, a substantially rigid thin-sheet panel assembly having a non-rigid thin-sheet component includes the thin-sheet component which has selected plan area and shape, a hacker having a plan shape and area substantially similar to the thin-sheet component, and plural riser elements of selected height and configuration each extending from the backer to distal ends connected to a reverse surface of the thin-sheet component, the riser elements being configured and disposed in an array which causes the assembly to have substantial rigidity in a selected direction in the thin-sheet component.

18 Claims, 21 Drawing Sheets

(56) References Cited

U.S. PATENT DOCUMENTS

| | | | |
|---|---|---|---|
| 5,424,113 A * | 6/1995 | Ray et al. | 428/178 |
| 5,543,204 A * | 8/1996 | Ray | 428/179 |
| 5,609,942 A * | 3/1997 | Ray | 428/182 |
| 5,894,045 A * | 4/1999 | Desrondiers | 428/178 |
| 8,327,604 B2 * | 12/2012 | Reynolds et al. | 52/746.1 |
| 2004/0168383 A1 * | 9/2004 | Reynolds et al. | 52/273 |
| 2005/0183376 A1 * | 8/2005 | Shoji | 52/633 |
| 2007/0011983 A1 * | 1/2007 | Reynolds et al. | 52/633 |
| 2008/0155931 A1 * | 7/2008 | Shoji | 52/633 |
| 2010/0186336 A1 * | 7/2010 | Valente et al. | 52/578 |
| 2011/0005165 A1 * | 1/2011 | Stadthagen-Gonzalez | 52/783.1 |

* cited by examiner

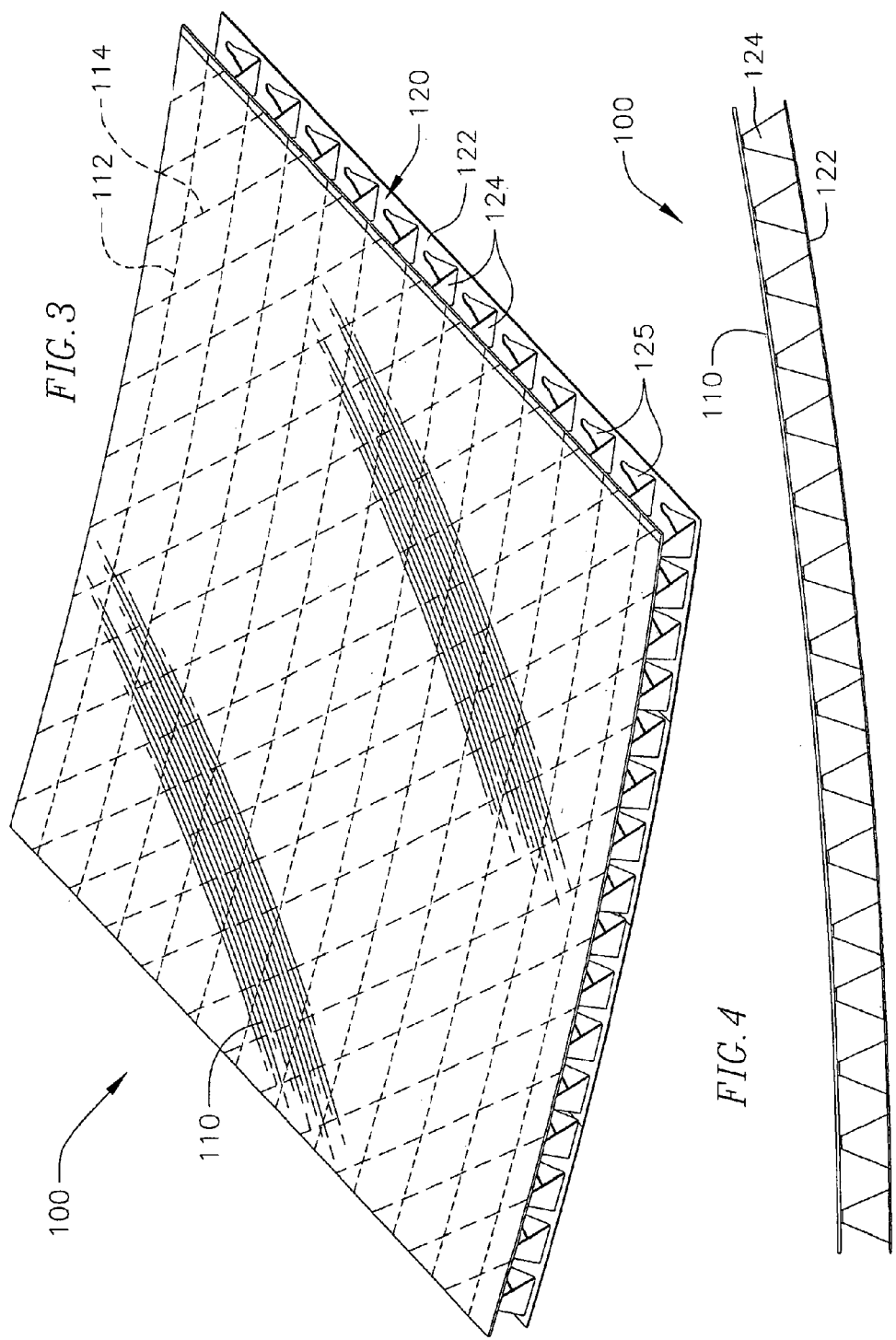

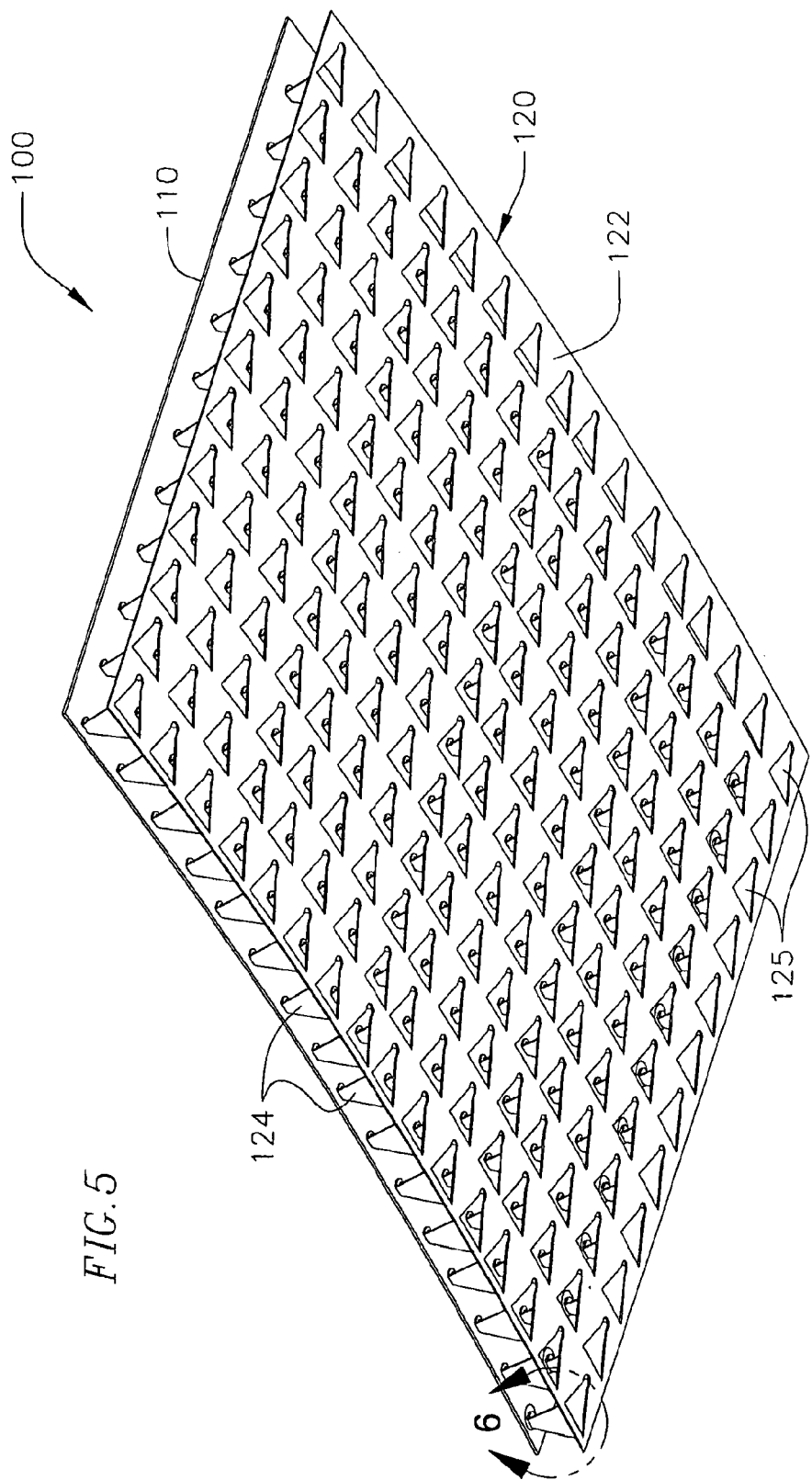

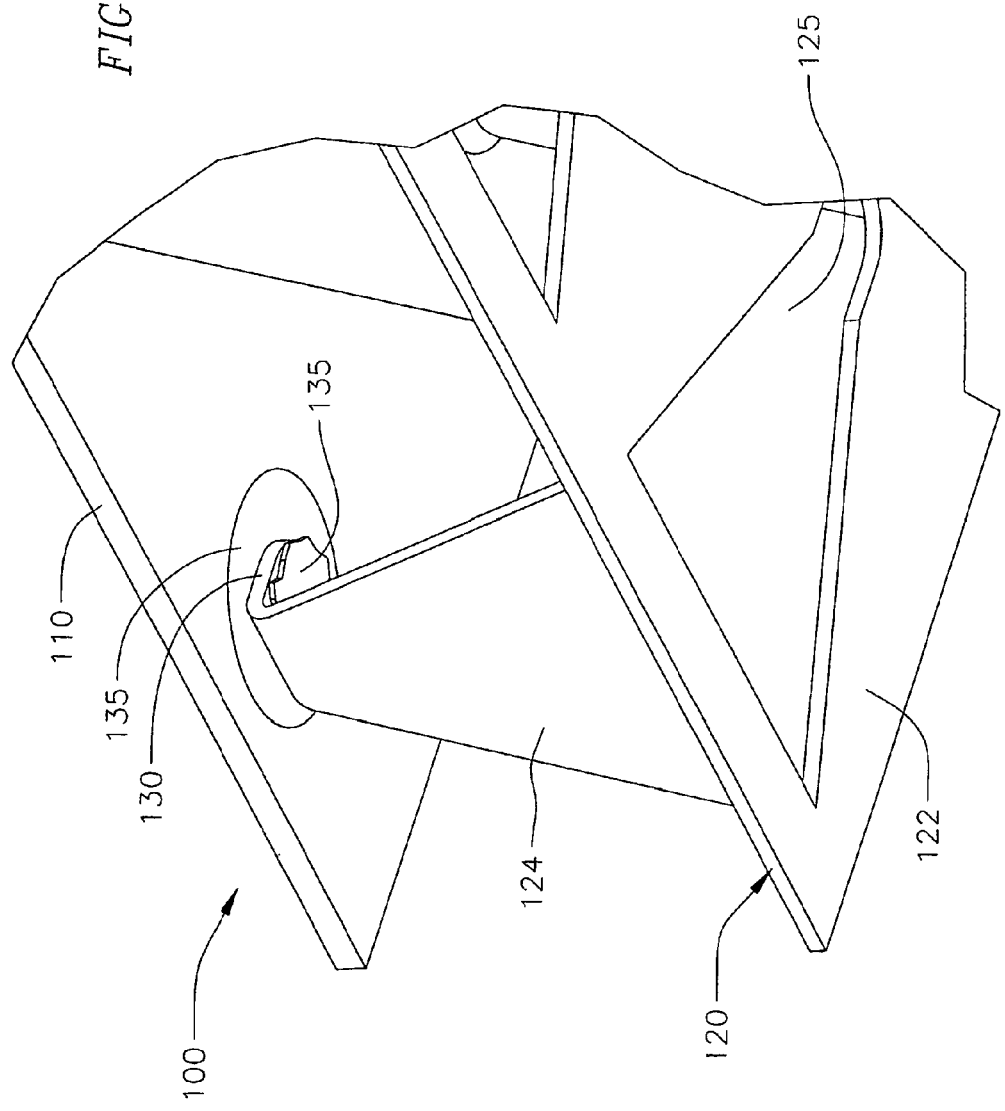

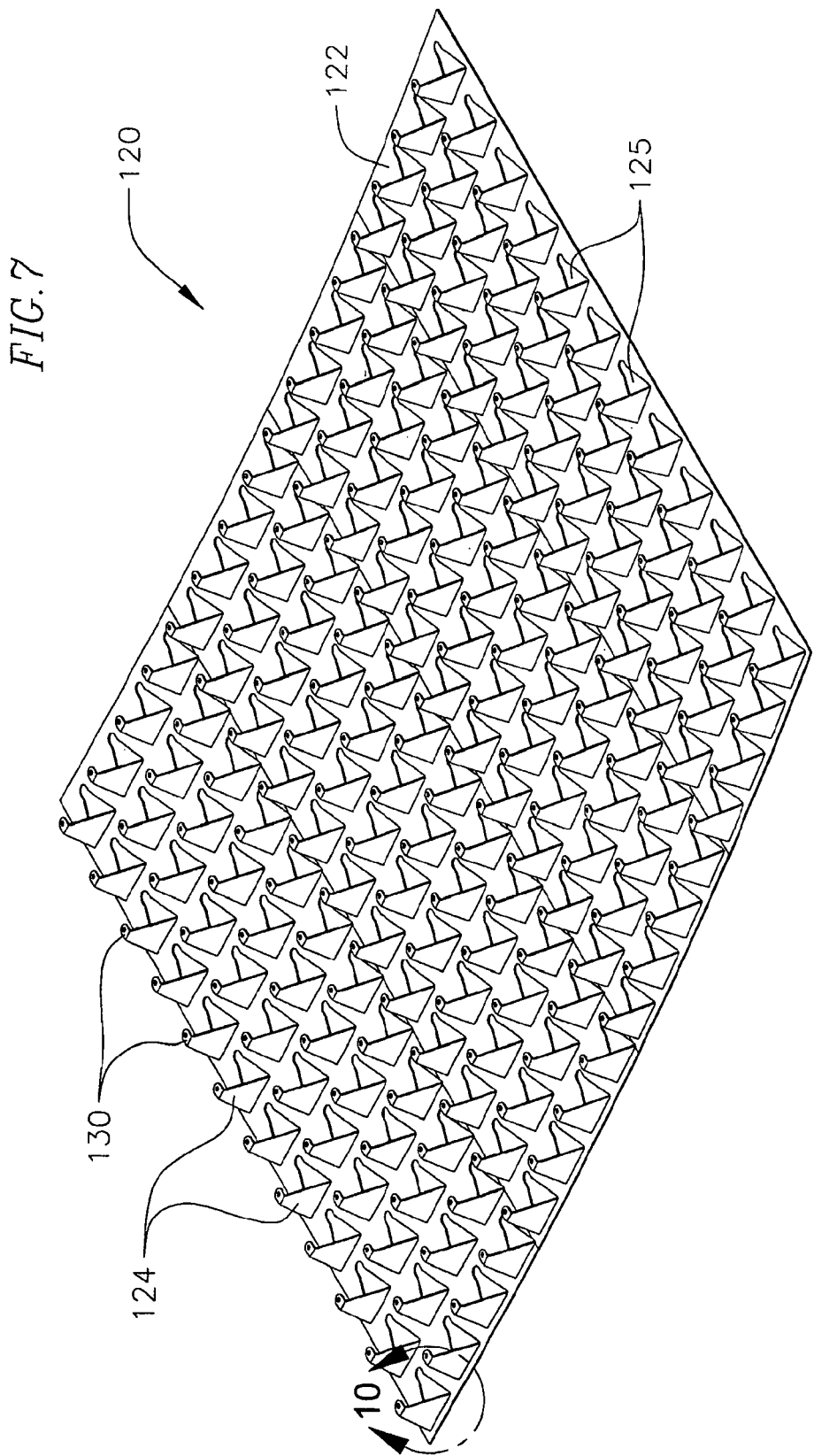

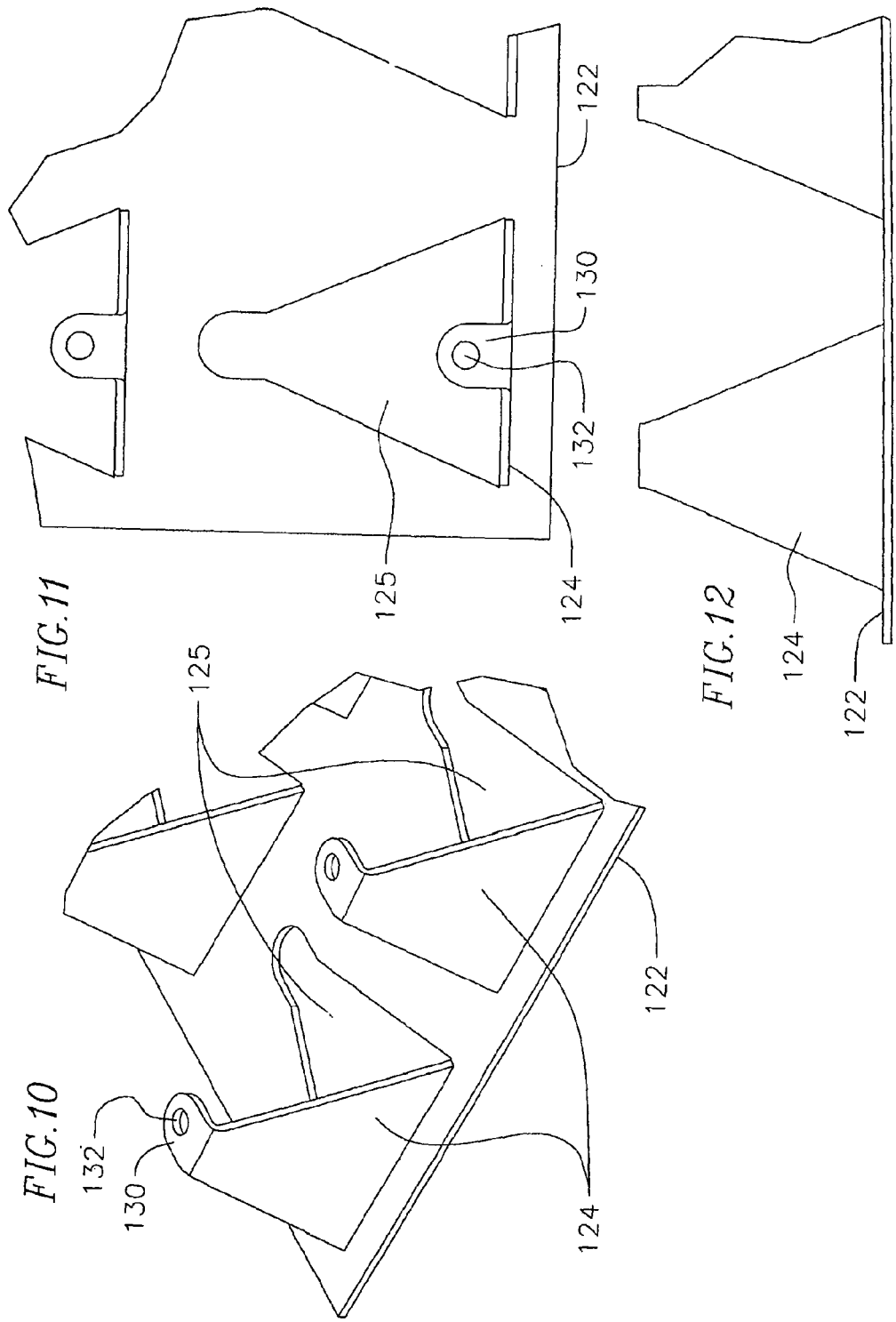

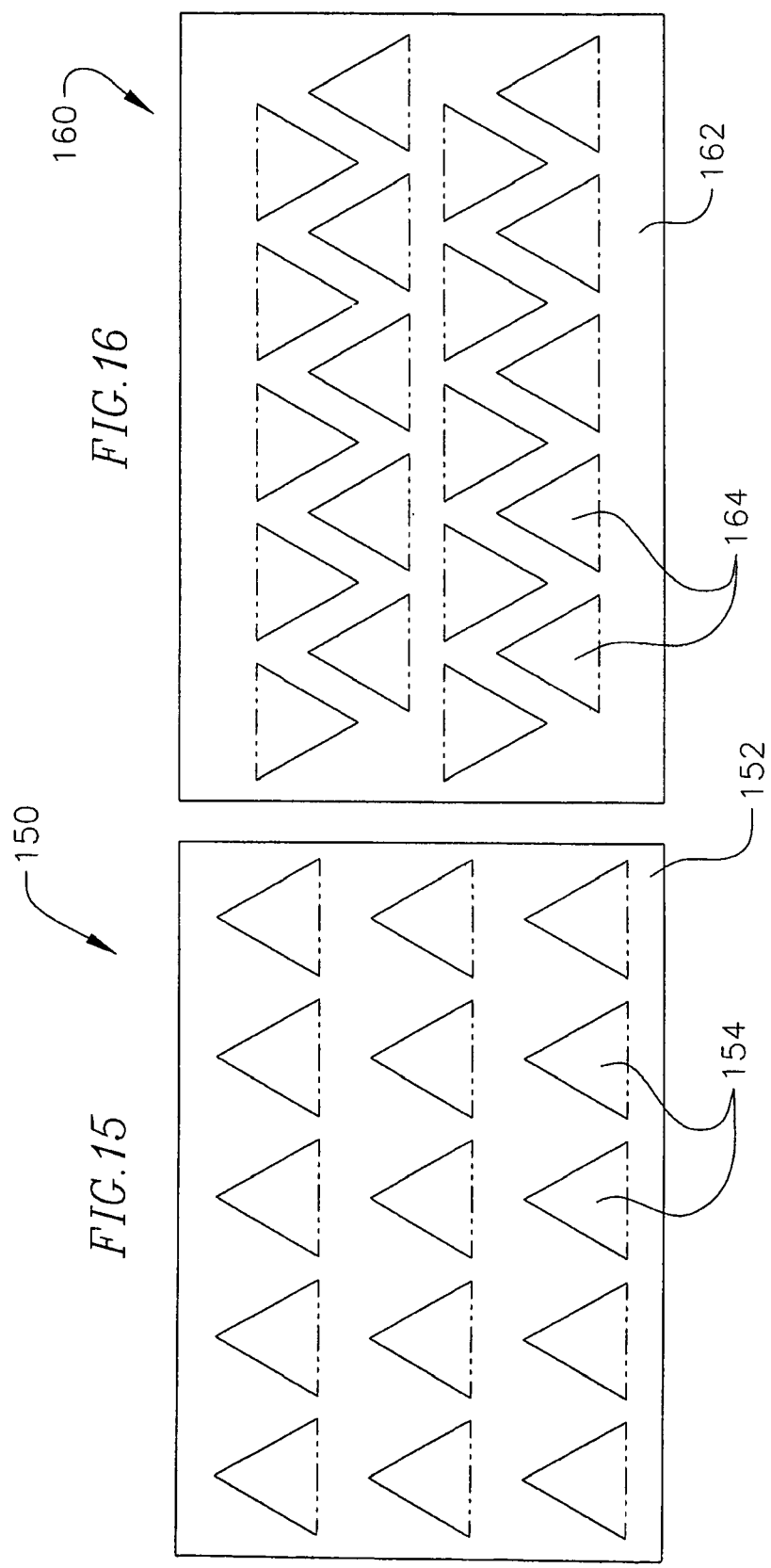

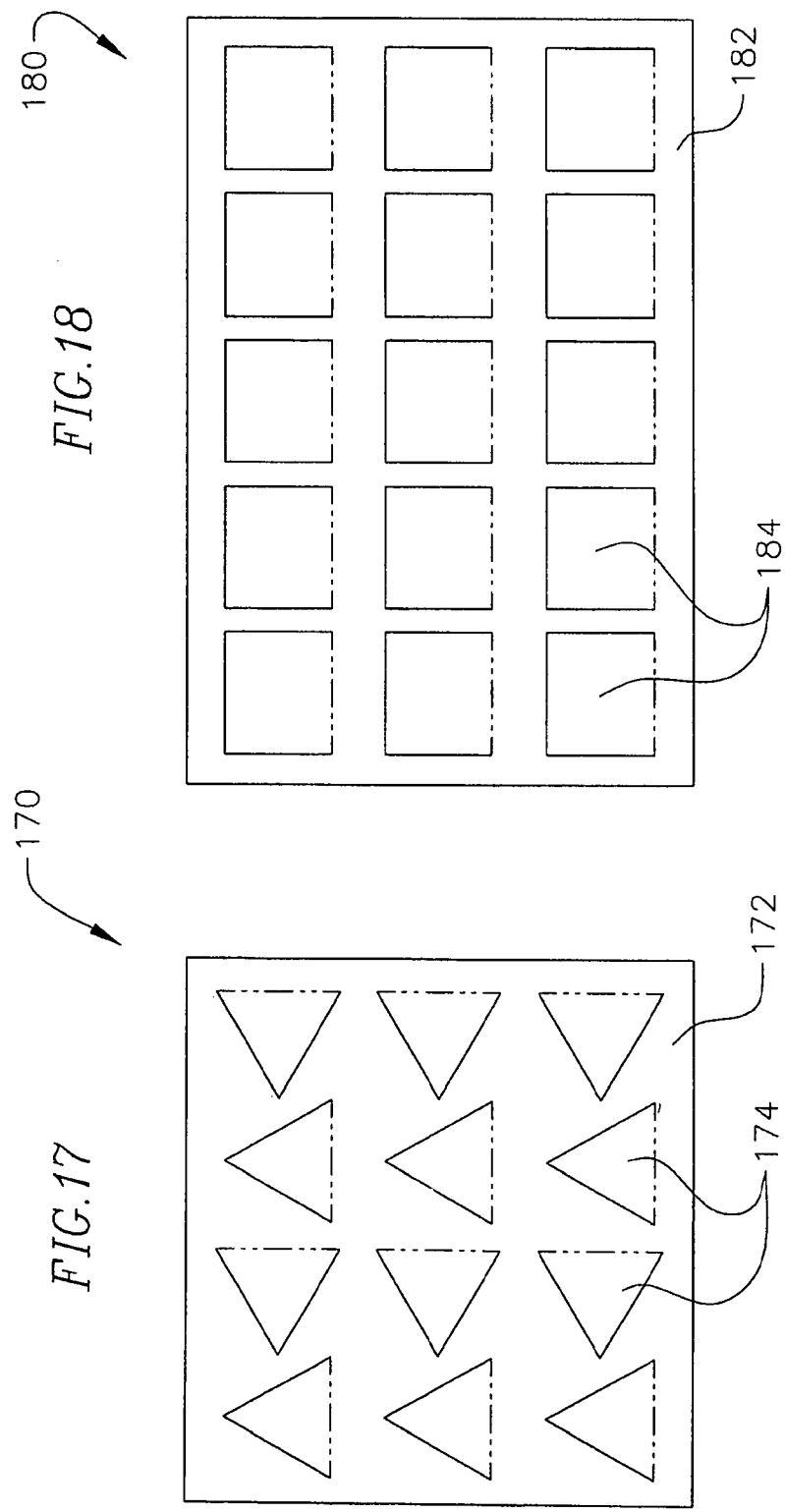

MINI-TRUSS THIN-SHEET PANEL ASSEMBLY

CROSS-REFERENCE TO RELATED APPLICATION(S)

This application claims priority to and the benefit of U.S. Provisional Application No. 60/999,833, filed on Oct. 18, 2007, the entire content of which is incorporated herein by reference.

FIELD OF THE INVENTION

The present invention relates generally to a thin-sheet panel assembly, and more particularly to a mini-truss thin-sheet panel assembly adapted for use in solar collector applications.

BACKGROUND OF THE INVENTION

Solar collection facilities utilize solar concentrators and/or photovoltaic panels for harnessing solar energy. Solar concentrator assemblies (SCAs) utilizing movable parabolic trough collectors present large reflective surface areas (apertures) for tracking the sun and focusing the captured radiant energy on linear heat collection elements (HCEs) as a first step in a thermomechanical conversion process for generating electrical power. A solar-trough solar power generation facility typically includes many SCAs arranged in rows to capture great amounts of solar radiant energy.

The reflective surfaces of troughs of SCAs are usually hot-formed, thick-glass mirrors that ideally conform to a given geometry, notably surface curvature. Operating efficiency of the solar plant is largely dependant on the ability of the mirrors to maintain surface curvature accuracy so that the mirrors sharply focus reflected sunlight on the HCE. This requires very exacting manufacturing processes for mirror production and high rigidity of the mirrors themselves as mounted to their supports. Thus, the glass is typically formed thicker, often resulting in a mirror weight that rivals the weight of the supporting structure.

Traditionally, hot-formed, glass mirrors are used in various solar concentrating applications, such as the Nevada Solar One solar power generating plant in Nevada. The glass mirror material is hot-formed to the mathematical shape (surface geometry) required to reflect and concentrate sunlight on an HCE. Such hot-formed glass is also known as sagged glass. Sagged glass is thick, heavy, costly to manufacture, costly to transport and install at a facility, and prone to breakage.

The thick glass mirrors (or any other reflectors utilized) must retain their mathematical shape in order to efficiently focus concentrated sunlight, which requires the hot-formed mirror glass to have a sufficient thickness to maintain the mirror shape (usually about three to five millimeters). Problems with the hot-formed glass include that the thicker glass reduces the reflective efficiency of the mirror (more absorption and less reflection of sunlight), has fabrication-related surface error limitations (slope error and edge effects), is more costly due to the increased amount of glass material, and is heavier resulting in undesirable shipping and handling issues. Additionally, thick sheet material is difficult to form in the complex shapes needed for solar power applications and may trap water in the interface which corrodes the silvering.

In some cases, thin-glass and thin-film have been bonded directly against a pre-formed substrate or aluminum plate having a desired curvature, or to a sandwich panel made with the required surface geometry. Sandwich panels are usually comprised of two sheet metal surfaces bonded to a cellular core such as a honeycomb configuration. Historical problems with thin-glass and thin-film bonded directly against a pre-formed curved substrate or plate, or in combination with honeycomb and other types of closed-cell panel construction, are high cost and their affinity for water intrusion when exposed to weather. Trapped water attacks the preferably aluminum components and penetrates the mirror coatings, causing the mirror silvering to corrode.

SUMMARY OF THE INVENTION

Aspects of embodiments of the present invention are directed to a mini-truss thin-sheet panel assembly. In embodiments of a mini-truss thin-sheet panel assembly according to the present invention, the "mini-truss" design of a backing material element is important to providing rigidity to the mini-truss thin-sheet panel assembly. Embodiments of the mini-truss thin-sheet panel assembly maintain a thin panel, such as a thin sheet of glass or other reflective material, in a rigid or substantially rigid configuration. Further, embodiments of the mini-truss thin-sheet panel assembly of the present invention may be utilized in solar collector troughs of a solar concentrator assembly (SCA), for example.

An aspect of embodiments of the mini-truss thin-sheet panel assembly according to the present invention, as utilized in an SCA, for example, is lighter weight and less costly reflective surfaces. For example, a thin-glass panel of a mini-truss thin-sheet panel assembly, according to an embodiment of the present invention, may have about one fourth of the thickness and weight of sagged glass, and may be manufactured in a flat configuration without hot-forming (but may later be "cold formed" to a desired shape or curvature) and, therefore, may be manufactured at less cost. Another aspect of embodiments of the mini-truss thin-sheet panel assembly is the "cold" formability of the thin-glass or thin-film. Yet another aspect of embodiments of the mini-truss thin-sheet panel assembly is greater overall mirror rigidity and, therefore, improved accuracy as utilized in an SCA, for example. Still another aspect of embodiments of the mini-truss thin-sheet panel assembly is increased ease of installation. Still another aspect of embodiments of the mini-truss thin-sheet panel assembly is reduced transportation costs. Still another aspect of embodiments of the mini-truss thin-sheet panel assembly is elimination or reduction of secondary breakage, such as may result from heavy wind forces applied against thick-glass structures. Still another aspect of embodiments of the mini-truss thin-sheet panel assembly is interchangeability with or use in combination with existing solar troughs or other devices. Still another aspect of embodiments of the mini-truss thin-sheet panel assembly is improved reflective performance. Still another aspect of embodiments of the mini-truss thin-sheet panel assembly is a substantially open architecture for allowing moisture to drain or evaporate and thereby prevent or deter the accumulation of moisture between components of the assembly.

According to one embodiment, a substantially rigid thin-sheet panel assembly having a non-rigid thin-sheet component includes the thin-sheet component which has selected plan area and shape, a backer having a plan shape and area substantially similar to the thin-sheet component, and plural riser elements of selected height and configuration each extending from the backer to distal ends connected to a reverse surface of the thin-sheet component, the riser elements being configured and disposed in an array which causes the assembly to have substantial rigidity in a selected direction in the thin-sheet component.

In one embodiment, the riser elements are of substantially uniform height from the backer so that the thin-sheet component and the backer have essentially concentric curvature. In one embodiment, an obverse surface of the thin-sheet component has concave curvature. In one embodiment, the concave curvature is parabolically cylindrical concave curvature.

In one embodiment, the selected direction is a circular direction substantially concentric to the center of area of the thin-sheet component. In one embodiment, the selected direction is at least one of two orthogonal directions in the thin-sheet component.

In one embodiment, the thin-sheet component includes a glass layer. In one embodiment, the thin-sheet component includes structural fibers for providing strength to the thin-sheet component.

In one embodiment, the backer is defined by a backer sheet, and the riser elements are defined by portions of the backer sheet that are bent away from the backer sheet and have integral connections to the backer sheet. In one embodiment, the portions of the backer sheet that define the riser elements have substantially triangular configurations and the integral connections of the riser elements to the backer sheet are at bases of the triangular configurations. In one embodiment, the integral connections of the riser elements to the backer sheet are spaced along substantially parallel lines, and the riser elements are in substantially parallel planes. In one embodiment, the parallel planes are in first and second groups, the parallel planes in the first group being substantially normal to the parallel planes in the second group. In one embodiment, the riser elements at their distal ends define connection tabs disposed laterally of the heights of the risers. In one embodiment, the backer sheet includes aluminum.

In one embodiment, the backer is defined by a first backer sheet and a second backer sheet, and the riser elements are defined by portions of the first backer sheet that are bent away from and have integral connections to the first backer sheet and portions of the second backer sheet that are bent away from and have integral connections to the second backer sheet, the portions of the first and second backer sheets that define the riser elements having substantially triangular configurations, the integral connections to the first and second backer sheets at bases of the triangular configurations, the integral connections to the first backer sheet spaced along substantially first parallel lines, the integral connections to the second backer sheet spaced along substantially second parallel lines, the riser elements of the first backer sheet in substantially first parallel planes, the riser elements of the second backer sheet in substantially second parallel planes, the first parallel lines substantially normal to the second parallel lines, and the first parallel planes substantially normal to the second parallel planes.

In one embodiment, the connections of the distal ends of the riser elements to the reverse surface of the thin-sheet component are bonded connections.

In one embodiment, the thin-sheet component includes a substrate layer composed principally of a selected synthetic resin material.

In one embodiment, the riser elements include apertures near the distal ends.

In one embodiment, the assembly defines a section of a larger parabolically curved cylindrical thin panel. In one embodiment, the backer has a curvature different from a curvature of the thin-sheet component. In one embodiment, the curvature of the backer is substantially flat.

In one embodiment, the thin-sheet component is reflective of electromagnetic radiation. In one embodiment, the thin-sheet component is reflective of solar radiation.

In one embodiment, the thin-sheet panel assembly has a substantially open architecture configured to allow moisture to drain or evaporate therefrom and deter accumulation of moisture in the thin-sheet panel assembly.

According to another embodiment, a support structure for supporting a thin panel to have a substantially rigid configuration includes a backer sheet, and a plurality of riser elements having heights extending in a first direction from proximal ends coupled to the backer sheet to distal ends and having lengths along rows in substantially parallel riser planes, the distal ends of the riser elements being attachable to the thin panel for supporting the thin panel and increasing rigidity of the thin panel in a second direction substantially parallel to the riser planes.

According to another embodiment, in a solar-trough solar power generation facility in which each one of a plurality of curved reflective surfaces supported by a respective one of a plurality of trough frames has a selected curvature, and the curved reflective surfaces having the selected curvature are configured to direct and concentrate sunlight onto a receiver, an improvement including a substantially rigid thin-sheet panel assembly including: a non-rigid thin-sheet component having a first surface; a backer; and plural riser elements of selected height and configuration each extending from the backer to distal ends connected to a reverse surface of the thin-sheet component, the reverse surface opposite the first surface, the riser elements being configured and disposed in an array which causes the assembly to have substantial rigidity in a selected direction in the thin-sheet component, the first surface of the thin-sheet component including at least a portion of one of the plurality of curved reflective surfaces having the selected curvature.

According to yet another embodiment, a method of forming a thin-sheet panel assembly having a thin-sheet component and a backer including a plurality of risers extending from the backer to distal ends includes: applying an adhesive to the distal ends of the risers; attaching the thin-sheet component to the distal ends of the risers via the adhesive; and shaping the thin-sheet panel assembly to have a selected curvature while the adhesive cures from an uncured state in which the adhesive does not adhere the thin-sheet component and the backer to one another to a cured state in which the adhesive adheres the thin-sheet component and the backer to one another.

In one embodiment, shaping the thin-sheet panel assembly includes: positioning the thin-sheet panel assembly between a first portion of a bonding fixture having a first curved surface and a second portion of the bonding fixture having a second curved surface, the first and second curved surfaces facing each other and substantially corresponding to the selected curvature; and clamping the first and second portions of the bonding fixture toward one another to restrain the thin-sheet panel assembly therebetween to have the selected curvature while the adhesive cures from the uncured state to the cured state.

Other features and advantages of the present invention will become apparent from the following detailed description, taken in conjunction with the accompanying drawings which illustrate, by way of example, the features of the present invention.

BRIEF DESCRIPTION OF THE DRAWINGS

FIG. 3 is a top perspective view of a mini-truss thin-sheet panel assembly according to an embodiment of the present invention;

FIG. 4 is a front view of the mini-truss thin-sheet panel assembly of FIG. 3;

FIG. 5 is a bottom perspective view of the mini-truss thin-sheet panel assembly of FIG. 3;

FIG. 6 is a detail bottom perspective view of a portion of the mini-truss thin-sheet panel assembly of FIG. 3;

FIG. 7 is a top perspective view of a backer of the mini-truss thin-sheet panel assembly of FIG. 3;

FIG. 10 is a detail top perspective view of a portion of the backer of FIG. 7;

FIG. 11 is a detail top view of a portion of the backer of FIG. 7;

FIG. 12 is a detail front view of a portion of the backer of FIG. 7;

FIG. 15 is a top schematic view of a backer of a mini-truss thin-sheet panel assembly according to another embodiment of the present invention;

FIG. 16 is a top schematic view of a backer of a mini-truss thin-sheet panel assembly according to another embodiment of the present invention;

FIG. 17 is a top schematic view of a backer of a mini-truss thin-sheet panel assembly according to another embodiment of the present invention;

FIG. 18 is a top schematic view of a backer of a mini-truss thin-sheet panel assembly according to another embodiment of the present invention;

DETAILED DESCRIPTION

In the following detailed description, certain exemplary embodiments of the present invention are shown and described, by way of illustration. As those skilled in the art would recognize, the described exemplary embodiments may be modified in various ways without departing from the spirit and scope of the present invention. Accordingly, the drawings and description are to be regarded as illustrative in nature, rather than restrictive.

The term "mini-truss," as used in the preceding summary and the following detailed description and claims of this application, refers to an assembly of members forming a rigid, or substantially rigid, framework.

Figure 1:
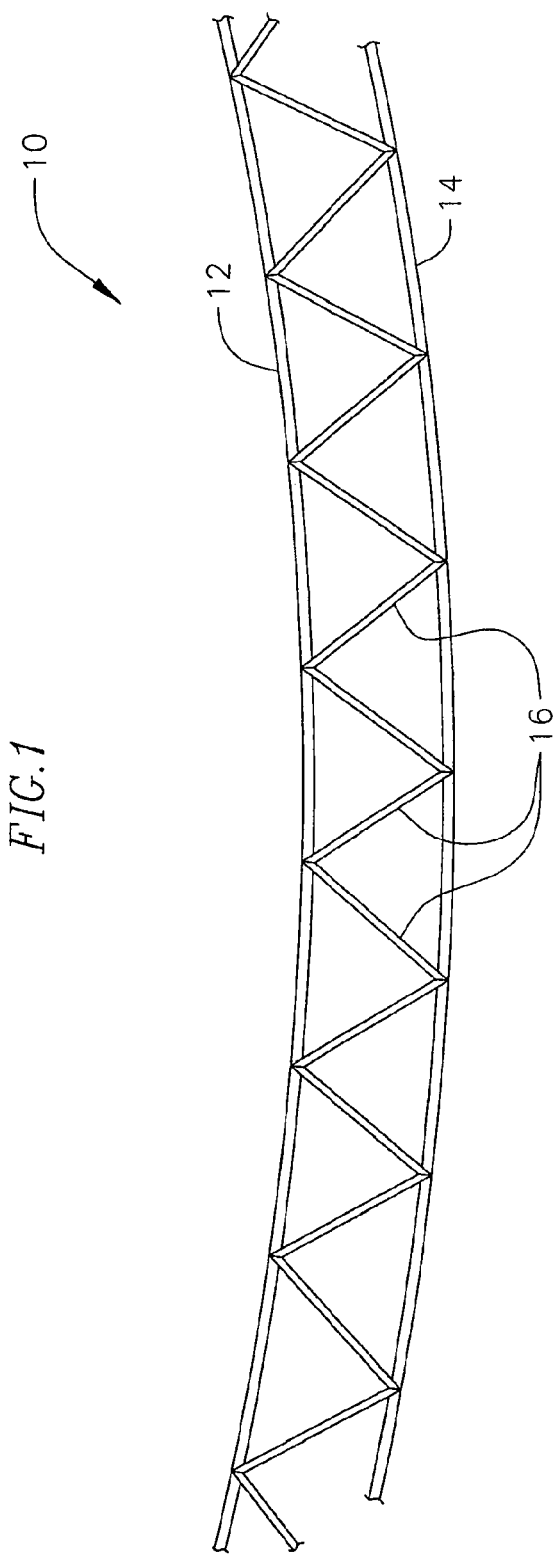
FIG. 1 is a front schematic view of a typical curved truss design.

With reference to FIG. 1, a typical curved truss structure 10 includes an upper chord 12, a lower chord 14, and diagonal elements 16, or lacing. The diagonal elements 16 extend between and connect the upper and lower chords 12, 14 at various locations to provide strength and rigidity to the truss structure 10.

Figure 2:
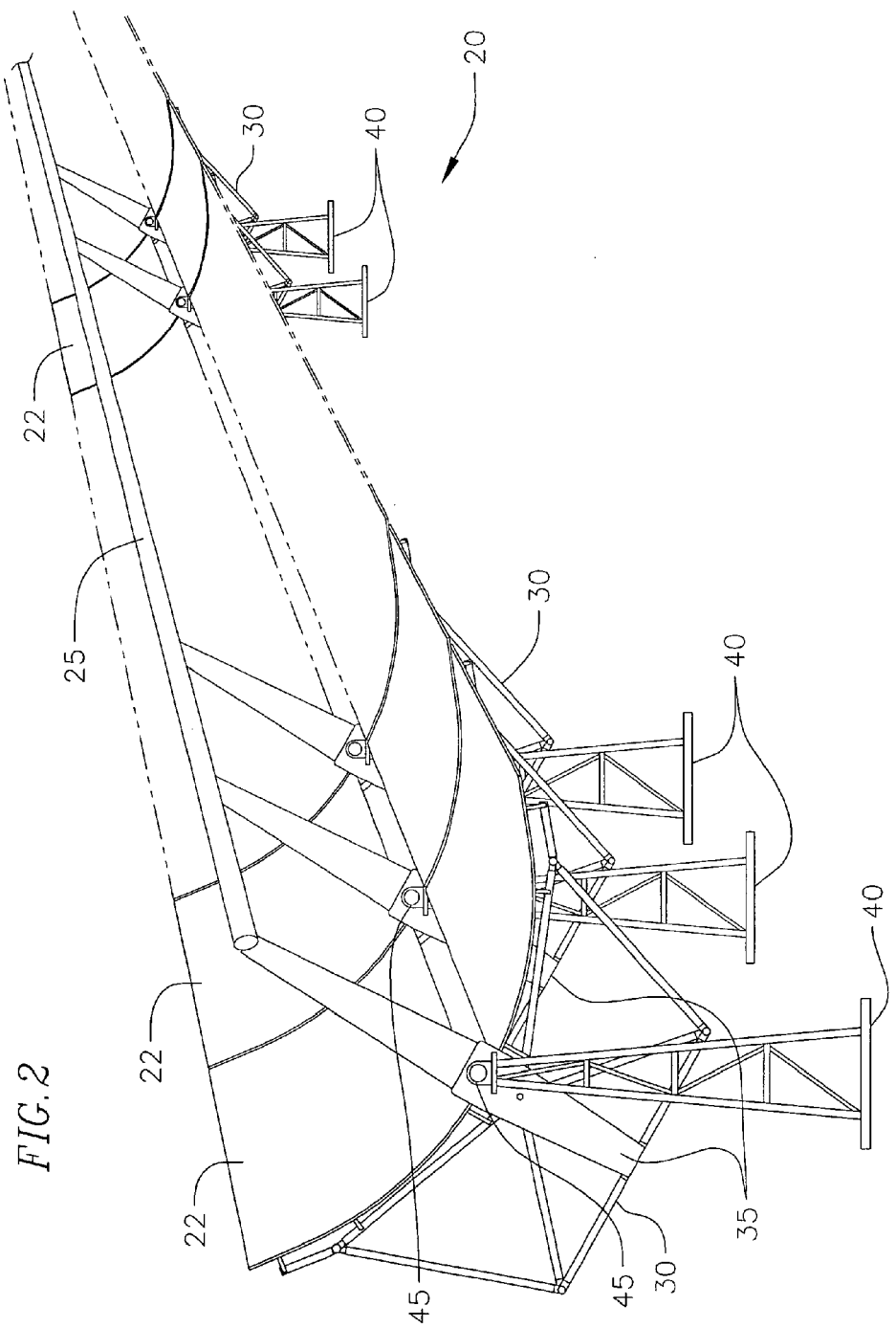
FIG. 2 is a perspective schematic view of a solar concentrator assembly.
Figures 8, 9:
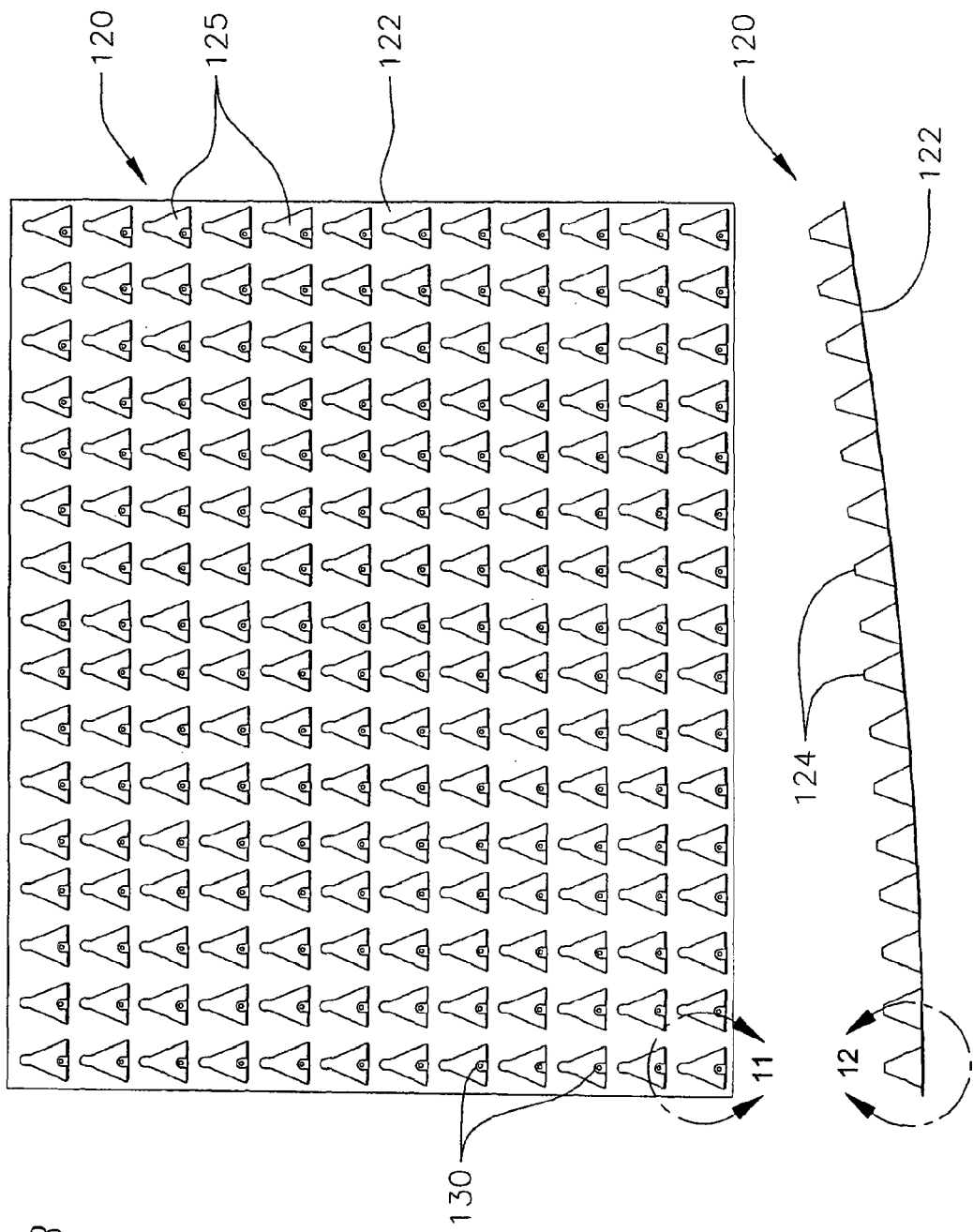
FIG. 8 is a top view of the backer of FIG. 7.
FIG. 9 is a front view of the backer of FIG. 7.

With reference to FIG. 2, a solar concentrator assembly ("SCA") 20 includes a row of parabolic, cylindrically curved, or otherwise curved, troughs 22 for collecting radiant solar energy. The troughs 22 have reflective surfaces for reflecting and focusing the radiant energy on a heat collection tube 25. Each of the troughs 22 is supported by a corresponding trough frame 30, which may be constructed of tubes, bars, extrusions, and/or any other suitable structural members for supporting and maintaining the critical shape of each of the troughs 22 and the reflective surfaces thereon. Each of the trough frames 30 may include two torque plates 35, one on either side, for coupling to and supporting the trough frames 30 on supporting pylons 40. The torque plates 35, may, for example, be coupled to the supporting pylons 40 at bearings 45.

With reference to FIGS. 3-6, a mini-truss thin-sheet panel assembly 100 according to an embodiment of the present invention includes a thin sheet 110 and a backer 120 that are attached to one another at various locations. The configuration of the mini-truss thin-sheet panel assembly 100 provides rigidity to the thin sheet 110 and also maintains the thin sheet 110 in a shape having a desired curvature. For example, the reflective surfaces of the troughs 22 of the SCA 20, described above and shown in FIG. 2, may be embodied as the mini-truss thin-sheet panel assembly 100. As such, the reflective surfaces of the troughs 22 will be configured to maintain a selected curvature for focusing solar radiation.

The thin sheet 110 (upper chord), according to one embodiment, is a thin glass sheet. In one embodiment, the thin sheet 110 is non-rigid and has a glass thickness of about one to two millimeters (about 0.04 to 0.08 inches). Alternatively, the thin sheet 110 may include glass of any other suitable thickness. Moreover, other embodiments of the thin sheet 110 may be formed of any thin-gage, non-glass reflective material (see, e.g., U.S. Pat. No. 6,989,924 B1 and 2006/0181765 A1, and similar materials), such as a synthetic thin-film material, or a combination of materials, such as a thin-film on a flat sheet metal substrate. In one embodiment, the thin sheet 110 may be formed of a thin-film material on a substrate having a thickness of about 0.5 to 1.5 millimeters (about 0.02 to 0.06 inches), or alternatively, any other suitable thickness. The thin sheet 110 may be formed of a material that is reflective of electromagnetic radiation, such as solar radiation. Further, in other alternative embodiments, the thin sheet 110 may be formed of one or more materials that are non-reflective, having a suitable thickness for the desired application. Further, as described further below, a thickness of the thin sheet 110 (upper chord) may be selected depending on a thickness of a backer sheet (lower chord) of the backer 120.

The thin sheet 110, according to one or more embodiments, may include a secondary structural element such as a thin layer of fiberglass, or similarly applied alternative suitable material, that provides relief for thin glass where tensile loads may become excessive. For example, first structural fibers 112 may be bonded, or otherwise attached, to a bottom surface of the thin sheet 110 before the mini-truss thin-sheet panel assembly 100 is shaped to have a selected curvature.

The first structural fibers 112 are attached to the thin sheet 110 having a direction that is substantially parallel to planes of risers of the backer 120 (see FIG. 3). Similarly, second structural fibers 114 may be bonded, or otherwise attached, to a bottom surface of the thin sheet 110 before the mini-truss thin-sheet panel assembly 100 is shaped to have a selected curvature. The second structural fibers 114 are attached to the thin sheet 110 in a direction diagonal to the first structural fibers 112 (see FIG. 3). The second structural fibers 114 may be applied to the thin sheet 110 in substitution of, or in addition to, the first structural fibers 112.

The first and second structural fibers 112, 114, or a similar alternative structural element, provide strength to thin glass. Moreover, the first and second structural fibers 112, 114 are bonded or otherwise applied to the thin sheet 110 before the mini-truss thin-sheet panel assembly 100 is shaped to have a selected curvature. As such, when the mini-truss thin-sheet panel assembly 100 is shaped to have a selected curvature, the first and second structural fibers 112, 114 will be placed in tension, and the thin glass will thereby be placed in compression and remain in compression during use of the shaped mini-truss thin-sheet panel assembly 100. This is beneficial because glass has optimal strength when in compression.

With further reference to FIGS. 3-6, and also with reference to FIGS. 7-12, the backer 120 includes a backer sheet 122 (lower chord). The backer sheet 122, according to one embodiment, is formed from aluminum sheet metal having a thickness of about 0.5 to 1.5 millimeters (about 0.02 to 0.06 inches). Alternatively, any other suitable material may be used to form the backer sheet 122, including any other suitable sheet metal or other material having any suitable thickness. Further, a thickness of the backer sheet 122 may be selected in cooperation with a thickness and structural characteristics of the thin sheet 110 so that, for example, the strengths of the thin sheet 110 (upper chord) and the backer sheet 122 (lower chord) are substantially balanced.

The backer 120 further includes a plurality of risers 124 (diagonal elements). The risers 124, according to one embodiment, are arranged in multiple rows, and may be uniformly spaced in a grid or array pattern. Each of the risers 124, according to one embodiment, is integrally formed from the backer sheet 122 and has a substantially triangular-shaped configuration. The risers 124 may be formed by shearing, punching, cutting, water jet, or any other suitable device or method for separating the risers 124 from the backer sheet 122, on two sides of the triangular shapes of the risers 124. Further, in the embodiment shown, the risers 124 are folded away from the backer sheet 122 at a third side (i.e. a bend line) of the triangular shapes such that the risers 124 have a height from a proximal end (the integrally attached bend line) to a distal end. The risers 124, according to one embodiment, have substantially uniform heights from the backer sheet 122, which may be selected depending on thicknesses of the thin sheet 110 and the backer sheet 120. The risers 124 may be folded, or bent, utilizing a progressive die or any other suitable device or apparatus, or alternatively may be folded by hand. When the risers 124 are folded and extend away from the backer sheet 122, corresponding substantially triangular-shaped openings 125 remain in the backer sheet 122.

The rows of the risers 124, in one embodiment, are in substantially parallel planes. That is, the fold lines of each of the risers 124 are spaced apart and substantially parallel to one another, and the risers 124 are in planes that are substantially parallel to one another. Further, the risers 124 are in planes that are substantially perpendicular to the backer sheet 122. In an assembled embodiment of the mini-truss thin-sheet panel assembly 100, the planes of the risers 124 are substantially perpendicular to an axis about which a curvature is formed in the mini-truss thin-sheet panel assembly 100 (see FIG. 4). As such, the risers 124 will provide stiffness and rigidity to the mini-truss thin-sheet panel assembly 100 in a direction that will prevent or reduce any disruption from the selected curvature (e.g., by mirror deflections and/or thermal expansion and contraction), such as after installation at a solar facility.

Further, according to one embodiment, each of the risers 124 has an adhesive pad 130 ("connection tab") protruding from the triangular shape at a distal end of each of the risers 124. The adhesive pads 130 provide spaced apart regions of surface area for attaching the risers 124 to the thin sheet 110. Each of the adhesive pads 130 may be formed by bending a portion of each of the risers 124 at a distal end of the riser 124, such as bending the distal end at an angle of approximately 90 degrees. As such, the adhesive pad 130 is substantially perpendicular to the rest of the riser 124 and substantially parallel to the backer sheet 120.

Further, in one embodiment, as shown in detail in FIG. 11, each of the adhesive pads 130 has a small aperture 132 to allow an adhesive or other bonding agent to pass through the aperture 132 to a side of the adhesive pad 130 opposite to the side on which the adhesive is applied and thereby form a mechanical attachment to both sides of the adhesive pad 130 (see, e.g., FIG. 6).

Figure 13:
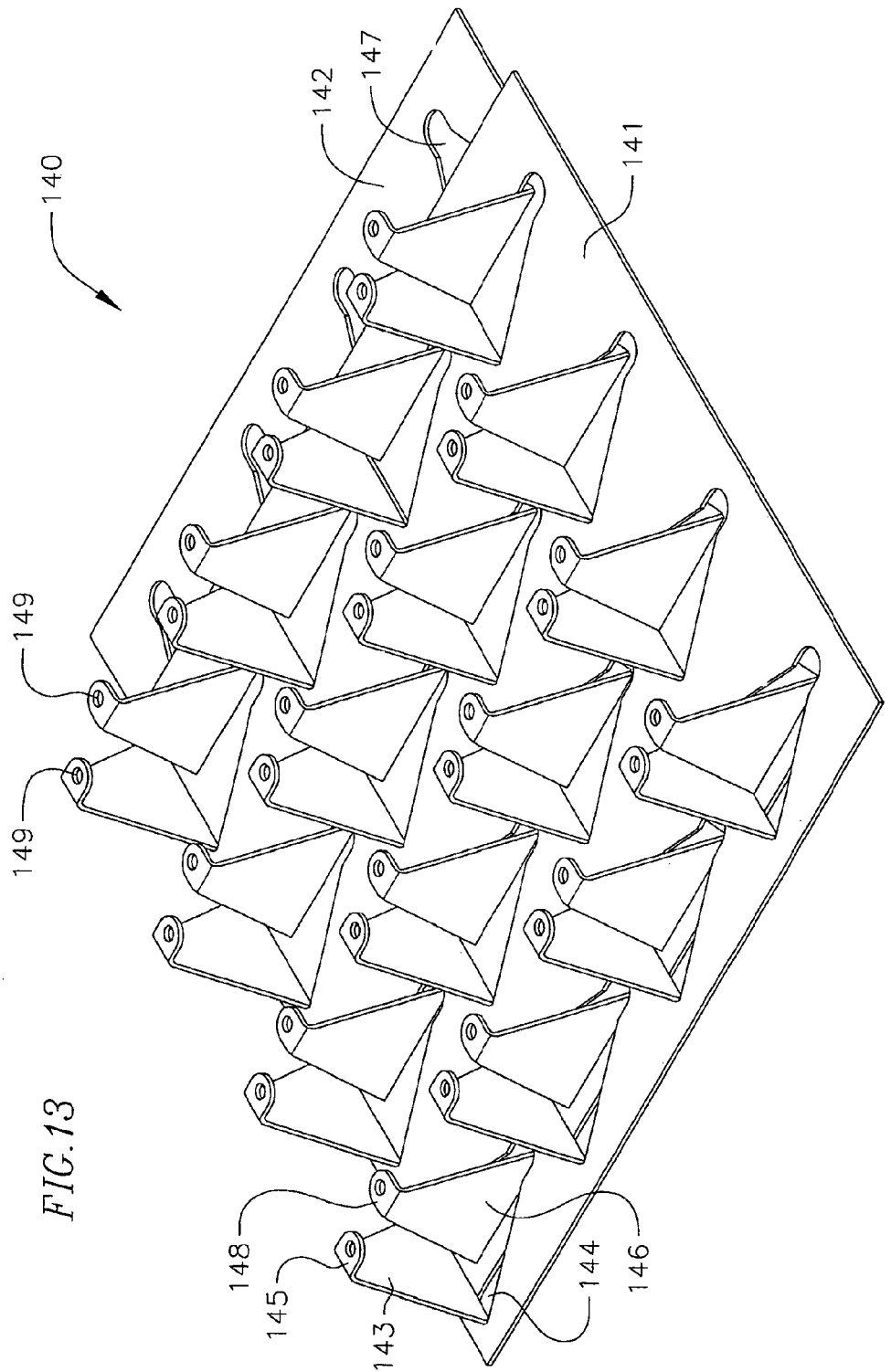
FIG. 13 is a top perspective view of a backer of a mini-truss thin-sheet panel assembly according to another embodiment of the present invention.
Figure 14:
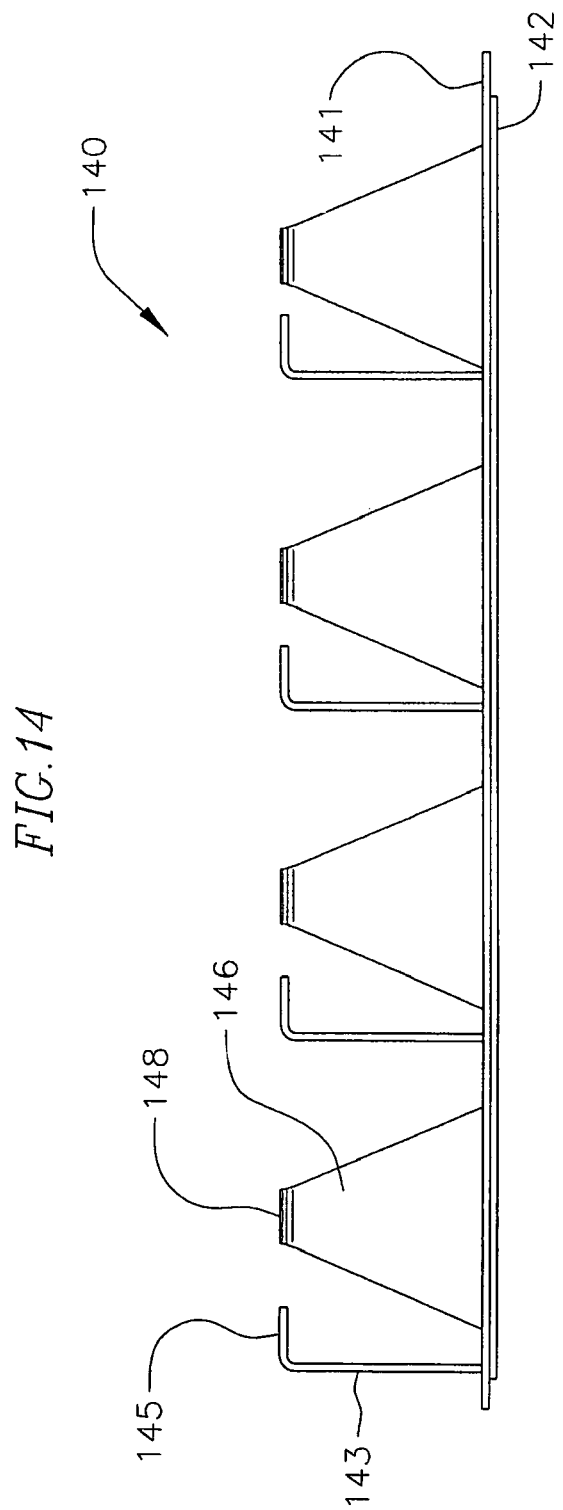
FIG. 14 is a side view of the backer of FIG. 13.

With reference to FIGS. 13 and 14, another embodiment of a mini-truss thin-sheet panel assembly according to the present invention includes a backer 140. The backer 140 includes a first backer sheet 141 and a second backer sheet 142 that are each substantially similar to the backer sheet 122 of the backer 120 described above. The first and second backer sheets 141, 142 are stacked with a lower surface of the first backer sheet 141 resting on an upper surface of the second backer sheet 142.

The first backer sheet 141 includes a plurality of first risers 143 formed in rows, the first risers 143 extending away from and substantially perpendicular to the first backer sheet 141, similar to the risers 124 of the backer 120 described above. The first risers 143 may be integrally formed from the first backer sheet 141, such as cut from and bent away from the first backer sheet 141 at a bend line to form a corresponding plurality of first openings 144 in the first backer sheet 141, similar to the backer 120 described above. Further, in one embodiment, each of the first risers 143 includes a first adhesive pad 145 that is formed by bending a distal end of each of the first risers 143.

The second backer sheet 142, similar to the first backer sheet 141, includes a plurality of second risers 146 formed in rows, the second risers 146 extending away from and substantially perpendicular to the second backer sheet 142. The second risers 146 may be integrally formed from the second backer sheet 142, such as cut from and bent away from the second backer sheet 142 at a bend line to form a corresponding plurality of second openings 147 in the second backer sheet 142. Further, in one embodiment, each of the second risers 146 includes a second adhesive pad 148 that is formed by bending a distal end of each of the second risers 146. Each of the second adhesive pads 148, and also the first adhesive pads 145, may include an aperture 149, similar to the apertures 132 of the backer 120 described above, for allowing an adhesive to spread to an opposite surface of each of the first and second adhesive pads 145, 148.

As described above and shown in FIGS. 13 and 14, the first backer sheet 141 rests on the second backer sheet 142. Further, each of the second risers 146 of the second backer sheet 142 extends through one of the first openings 144 of the first backer sheet 141. The first and second backer sheets 141, 142 are oriented relative to one another such that the planes of the first risers 143 are substantially perpendicular to the planes of the second risers 146. That is, the rows of the first risers 143 run substantially perpendicularly to the rows of the second risers 146. Such a configuration of the first and second risers 143, 146 provides the backer 140 with stiffness in two directions. Both the first risers 143 and the second risers 146, in one embodiment of the mini-truss thin-sheet panel assembly, are attached to a thin sheet at the first and second adhesive pads 145, 148, such as via an adhesive.

Alternatively to the backers 120, 140 described above, embodiments of a mini-truss thin-sheet panel assembly according to the present invention may include a backer having any suitable configuration for maintaining the thin sheet 110 in a rigid or substantially rigid configuration and having a desired curvature. For example, with reference to FIG. 15, a backer 150, according to one alternative embodiment, includes a backer sheet 152 having a plurality of risers 154. The risers 154 also have triangular-shaped configurations, but differ from the risers 124 of the backer 120 in that the risers 154 have distal ends that terminate as corners of the triangular configurations, rather than having a protruding feature, such as the adhesive pads 130 of the risers 124. Further, though not shown in FIG. 15, the risers 154 may be staggered, for example, rather than arranged in regularly spaced rows and columns.

With reference to FIG. 16, another backer 160 includes a backer sheet 162 having a plurality of risers 164. As shown in FIG. 16, the risers 164 also have triangular-shaped configurations. However, distal ends of the risers 164 point in opposite directions in alternating rows.

With reference to FIG. 17, a backer 170 includes a backer sheet 172 having a plurality of risers 174. The risers 174 also have triangular-shaped configurations, but the triangular-shaped risers 174 are arranged at substantially right angles to one another in alternating rows. That is, fold lines of rows of a first group of the risers 174 are substantially perpendicular to fold lines of rows of a second group of the risers 174. Moreover, the first group of the risers 174 will extend from the backer sheet 172 in first group planes, and the second group of the risers 174 will extend from the backer sheet 172 in second group planes, the second group planes being substantially perpendicular to the first group planes. As such, the risers 174 of the backer 170 will provide rigidity to the mini-truss thin-sheet panel assembly in two directions.

Further, with reference to FIG. 18, a backer 180 according to another embodiment, includes a backer sheet 182 having a plurality of risers 184 extending away from the backer sheet. The risers 184 differ from the previously described embodiments in that the risers 184 have rectangular-shaped configurations.

With reference to FIGS. 15-18, as described above, the solid lines of the riser shapes shown indicate shear or separation lines, whereas the dashed lines represent fold lines where the risers 154, 164, 174, 184 are folded or bent away from the backer sheet 152, 162, 172, 182. Further, a backer of a mini-truss thin-sheet panel assembly may include any suitable combination of arrangements (e.g., radial or circular), shapes, sizes, and/or orientations of the risers, such as a combination of the riser configurations of the backers 120, 150, 160, 170, 180, as described above.

For example, arrangements and/or orientations of the risers may be selected to either accommodate or resist thermal expansion and/or contraction. Additionally, in yet another alternative embodiment, a mini-truss thin-sheet panel assembly according to the present invention may include risers having different heights from one another. In such an embodiment, for example, a thin sheet can be supported to have a desired curvature, and a backer sheet from which the risers of varying heights extend could have a substantially flat curvature.

Figure 19:
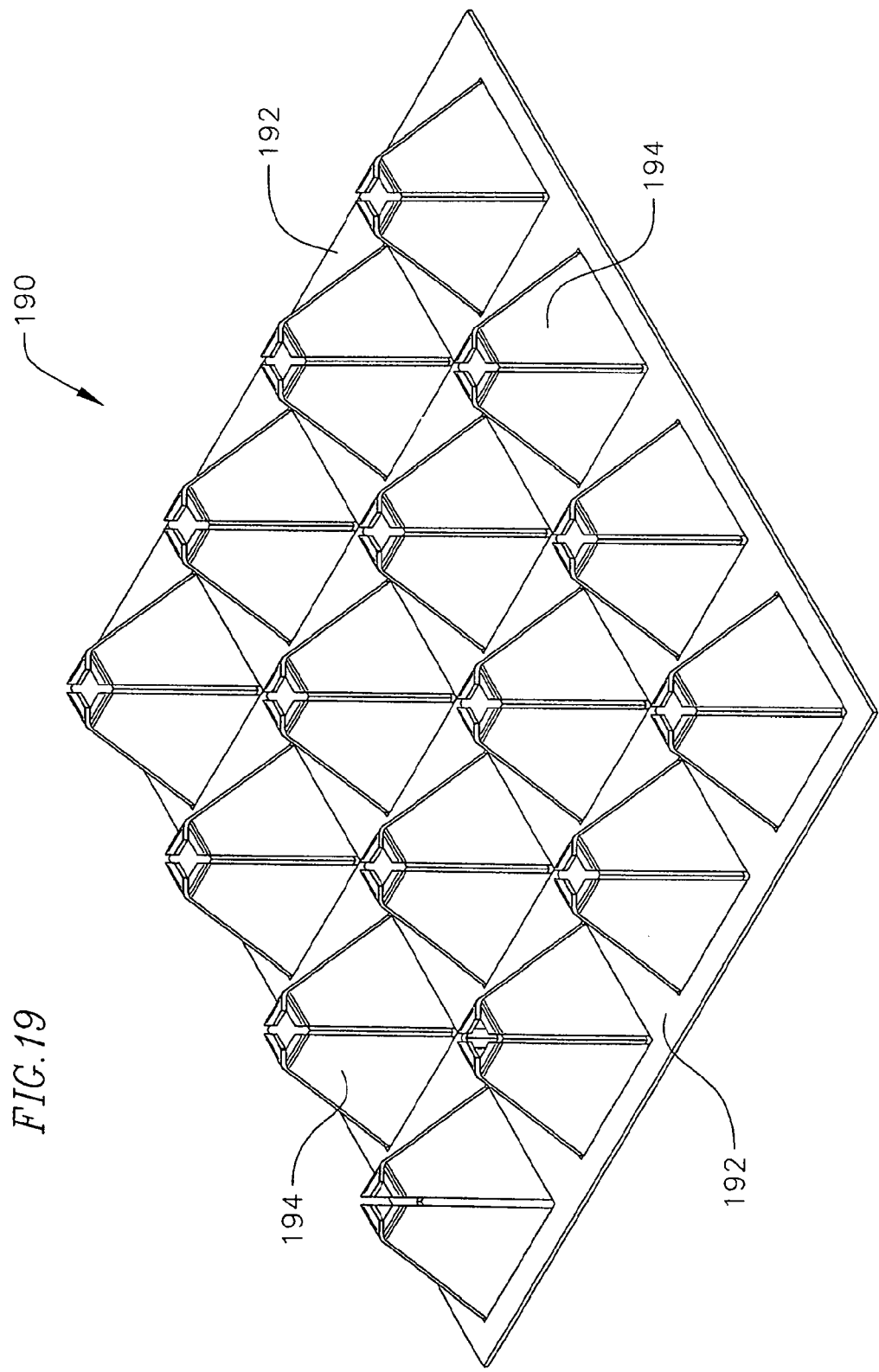
FIG. 19 is a top perspective view of a backer of a mini-truss thin-sheet panel assembly according to another embodiment of the present invention.
Figure 20:
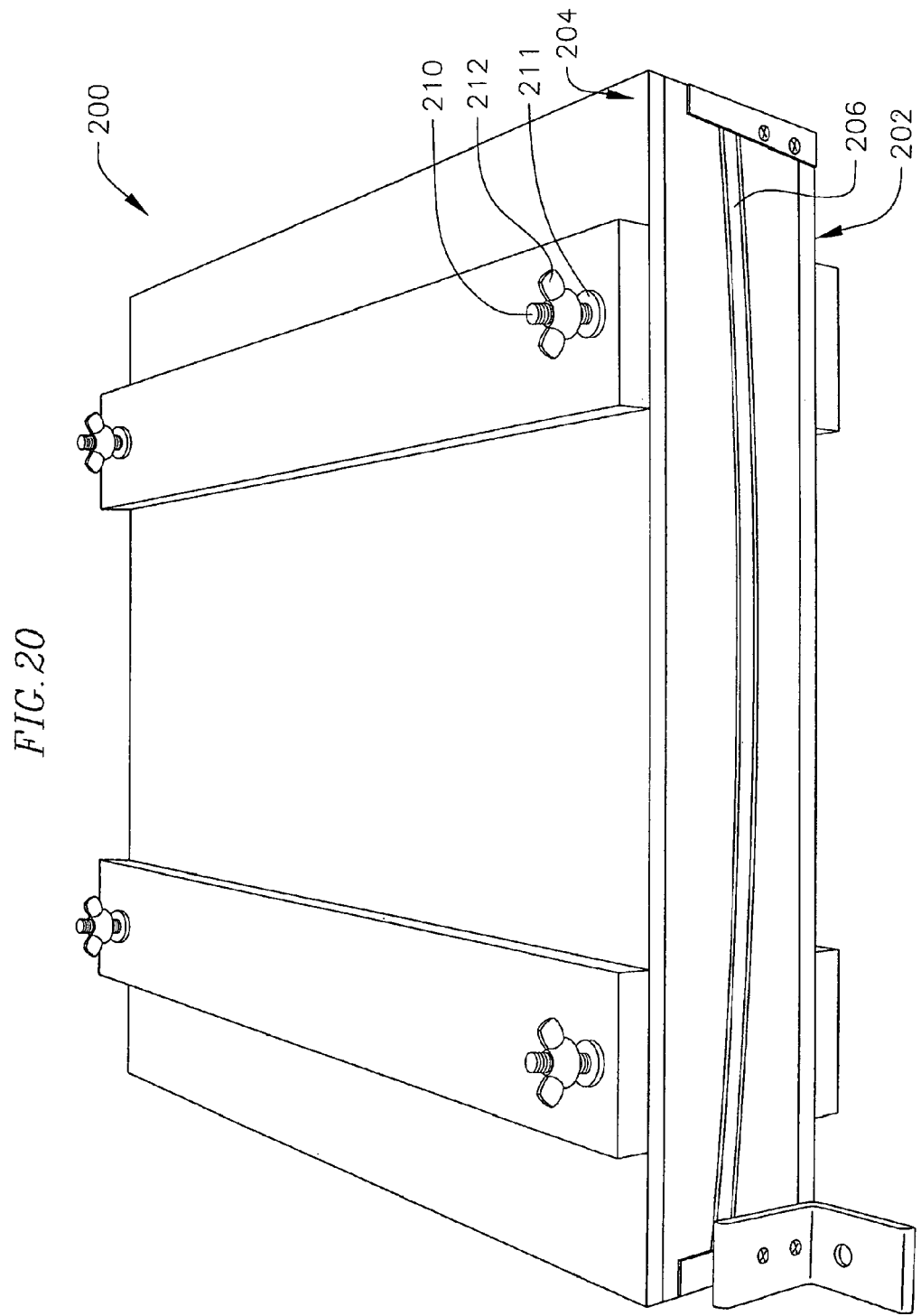
FIG. 20 is a top perspective view of a bonding fixture for shaping a mini-truss thin-sheet panel assembly according to an embodiment of the present invention.
Figure 21:
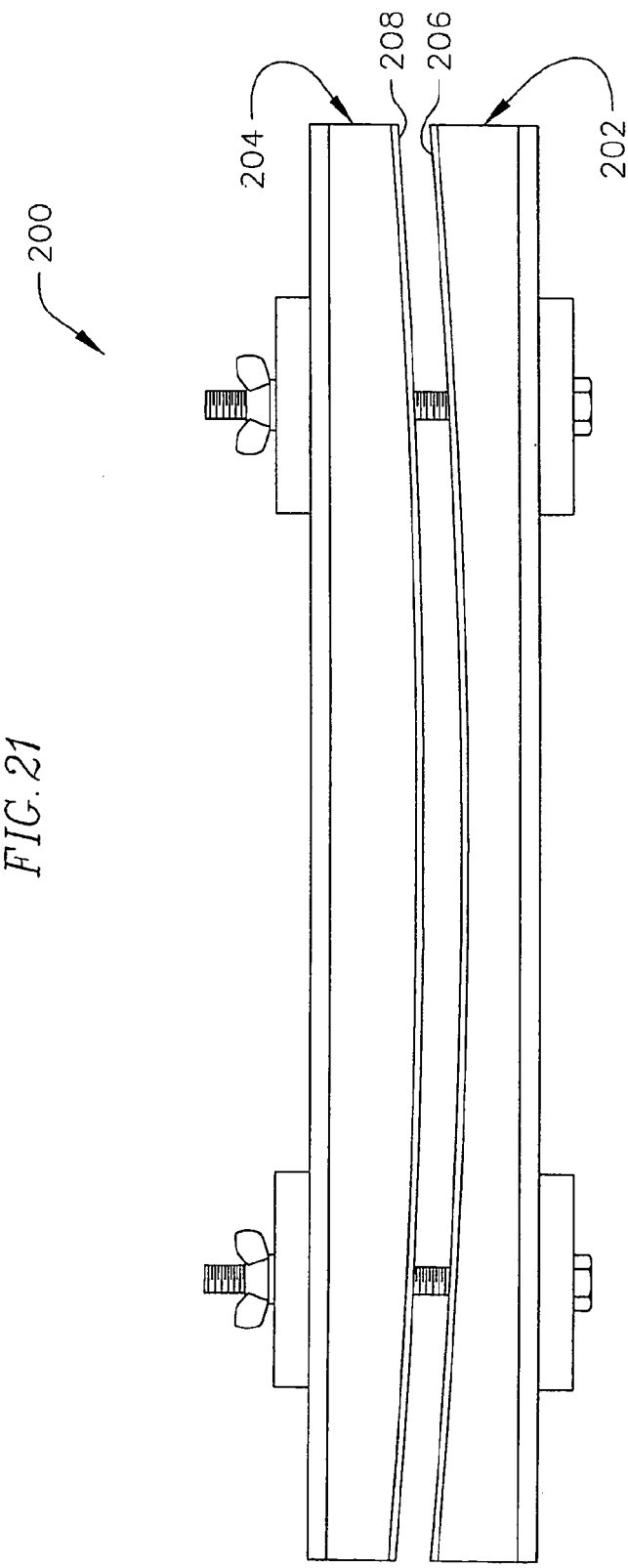
FIG. 21 is a front view of the bonding fixture of FIG. 20.
Figure 22:
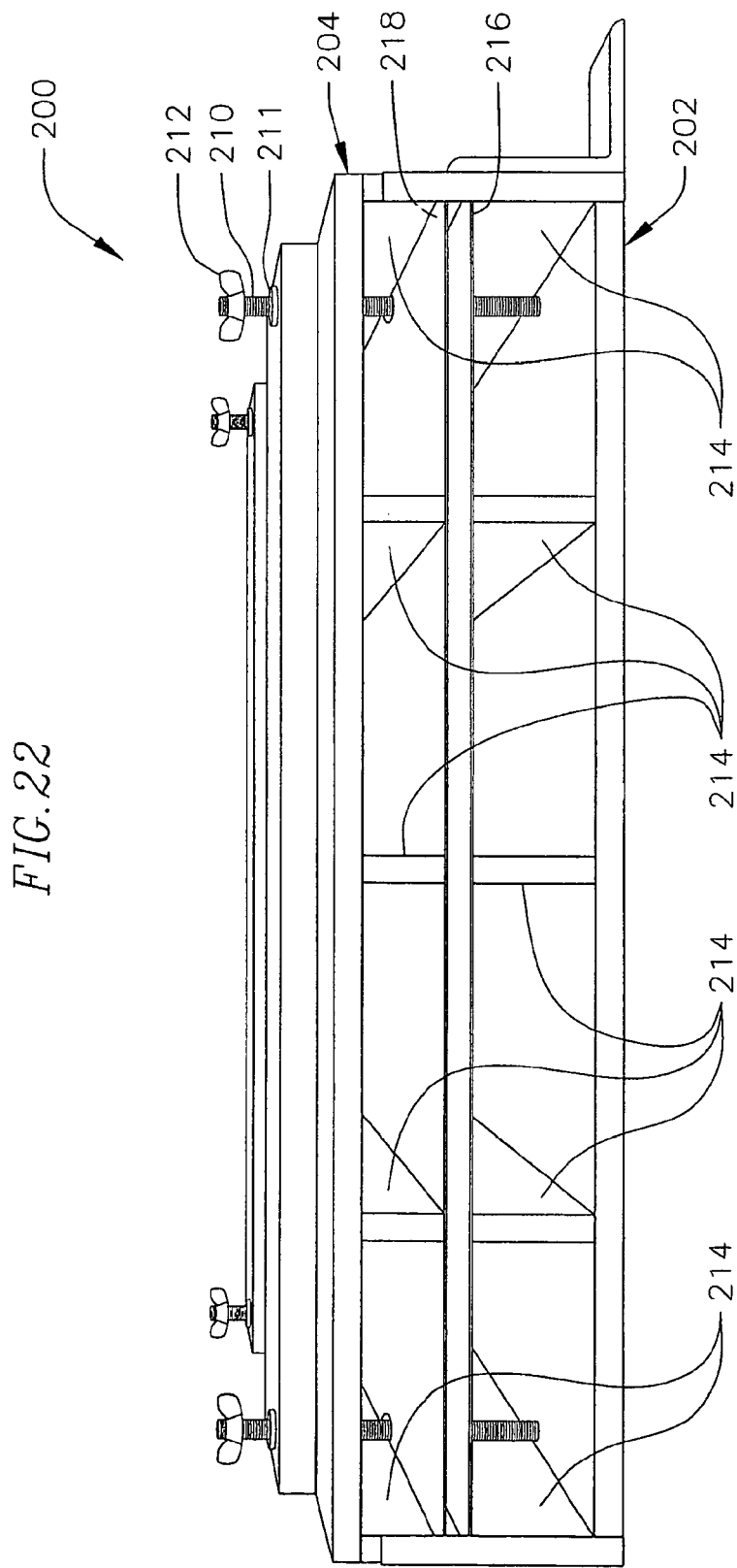
FIG. 22 is a side perspective view of the bonding fixture of FIG. 20.
Figure 23:
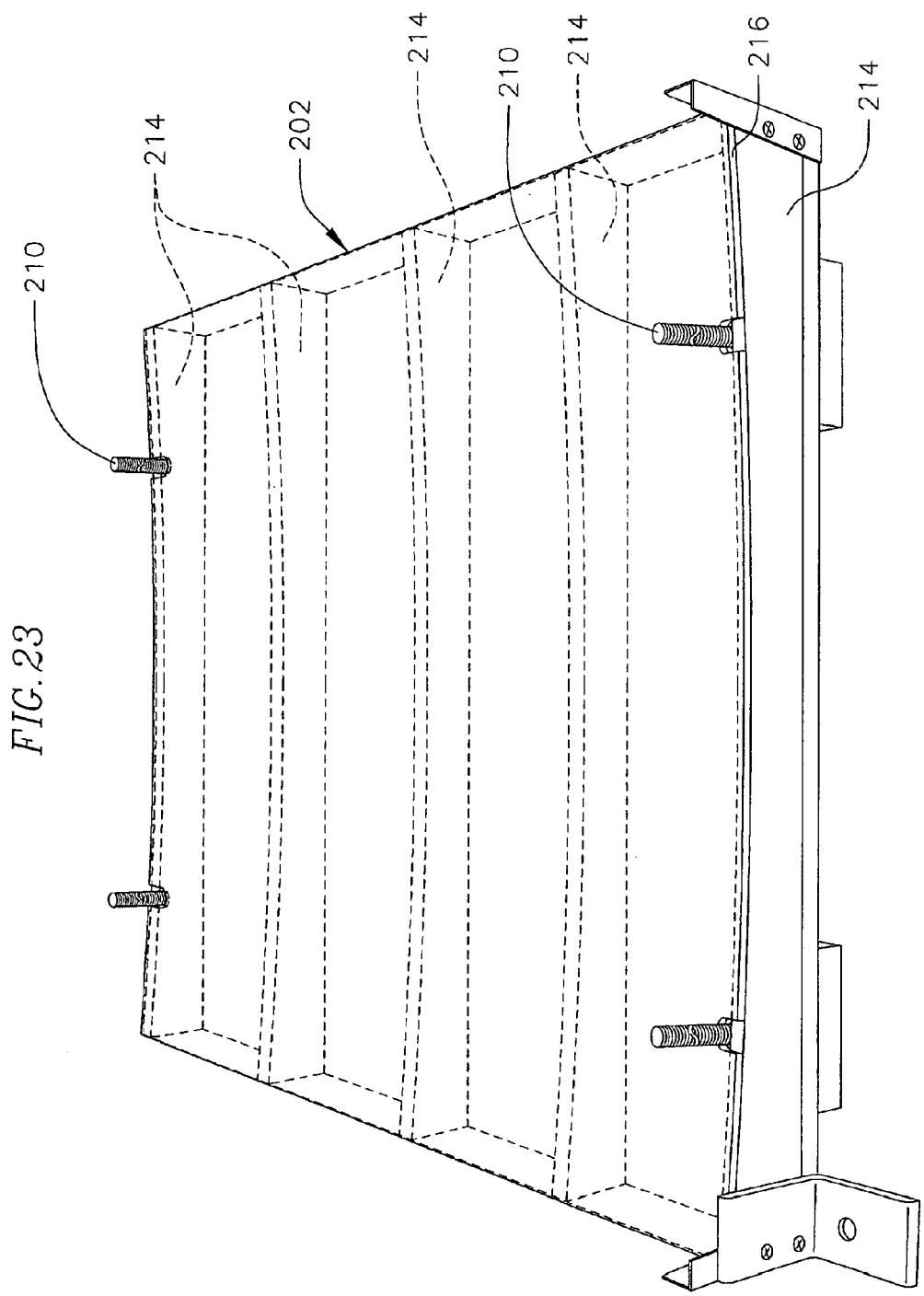
FIG. 23 is a top perspective view of a first portion of the bonding fixture of FIG. 20.
Figure 24:
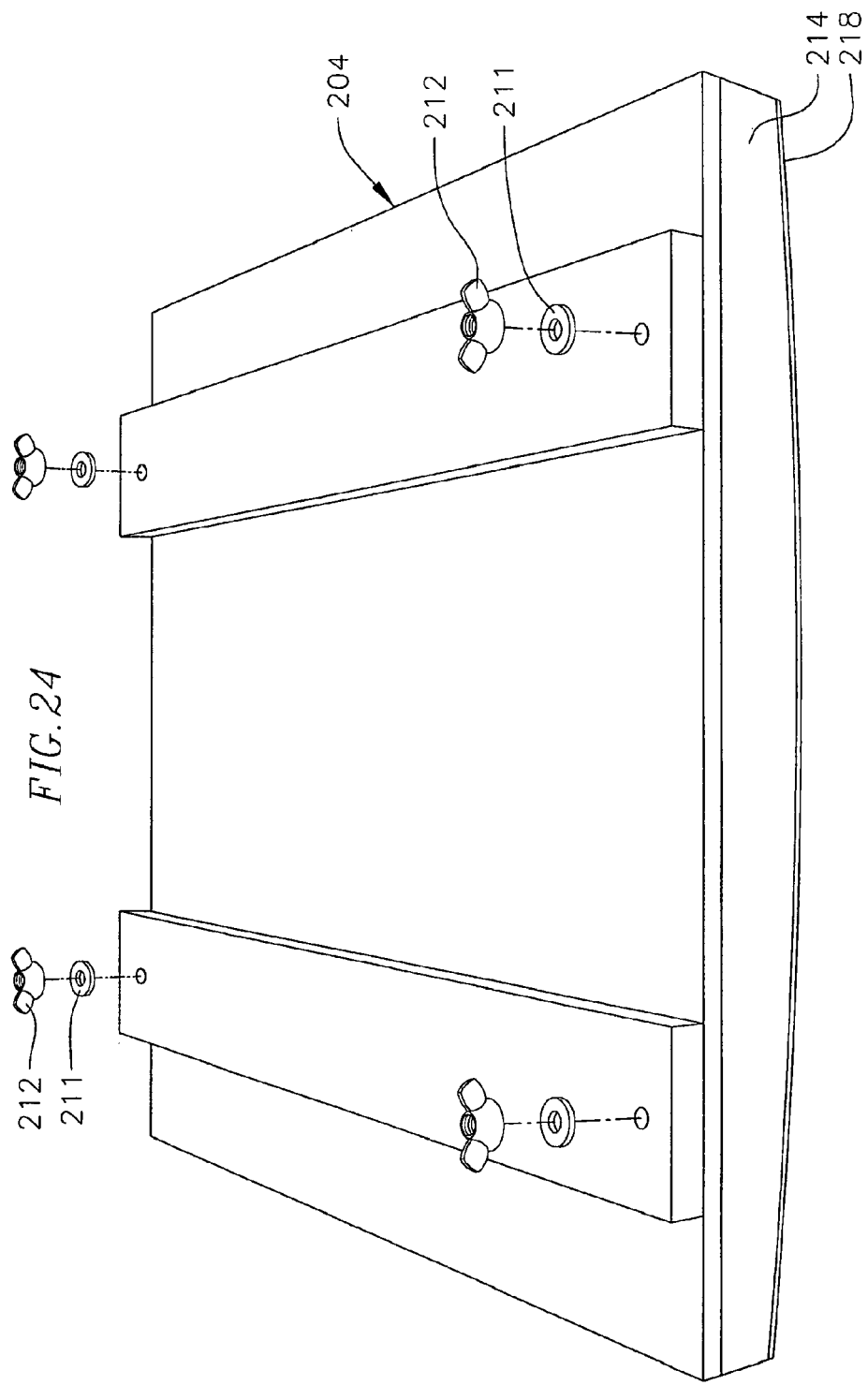
FIG. 24 is a top perspective view of a second portion of the bonding fixture of FIG. 20.

With reference to FIG. 19, in another embodiment, a backer 190 may include riser elements 194 formed by pressing a backer sheet 192 between two tooling plates having protrusions (e.g., similar to the protrusions of a waffle iron) so as to form corresponding protrusions that are the riser elements 194 in the backer sheet 192. As such, the riser elements 194 may be configured to provide stiffness to the backer 190 (and also to the mini-truss thin-sheet panel assembly) in two directions.

Alternatively, according to yet another embodiment of a backer, riser elements may include triangles or other shapes separated and bent away from a backer sheet, as described above with respect to the backer 120, but the riser elements may instead be grouped and the distal ends bent toward one another, such as by bending three or four triangular-shaped risers to form a pyramid-shaped configuration. A thin sheet may be attached to the distal ends of the riser elements that form the top of the pyramid.

Still other embodiments of a mini-truss thin-sheet panel assembly according to the present invention may include a backer that is formed of various elements that are not integral to one another, but rather are combined by fasteners, adhesive, or any other suitable device. That is, unlike the backers 120, 150, 160, 170, 180, 190 described above, in which the risers are formed from portions of the backer sheet, other embodiments may include riser elements that are separate from a backer sheet until they are attached to the backer sheet, such as by an adhesive or fastener. For example, one embodiment of a backer may include a fluted fiberglass panel forming risers (the diagonal elements of the mini-truss) and a separate flat panel forming the backer sheet (the lower chord of the mini-truss).

To assemble the mini-truss thin-sheet panel assembly 100, the thin sheet 110 and the backer 120 are attached to one another via bonding, fusing, adhesives, fasteners, or any other suitable device or combination thereof. In one embodiment, the thin sheet 110 and the backer 120 are adhered to one another utilizing an adhesive 135. The adhesive 135 may be an epoxy adhesive, or alternatively, may be any other suitable adhesive material. With reference to FIG. 6, in one embodiment, the adhesive 135 is applied to the adhesive pads 130 of the backer 120. The apertures 132 of the adhesive pads 130 allow the adhesive 135 to spread to each side of the adhesive pads 130, thereby providing a stronger adhesion of the thin sheet 110 and the backer 120 to one another.

Further, a computer numerical controlled (CNC) machine may be utilized to apply the adhesive 135 in selected regions (e.g., the adhesive pads 130) of the backer 120. By applying the adhesive 135 to the backer 120 utilizing a CNC machine, the adhesive 135 may be applied more quickly and positioned more accurately, for example.

The adhesive 135 may be cured or otherwise set to an adhering state, or cured more quickly, by putting the mini-truss thin-sheet panel assembly 100 in an oven or other temperature-controlling device for any suitable period of time until the thin sheet 110 and the backer 120 are adequately (e.g., permanently) adhered to one another.

Figure 27:
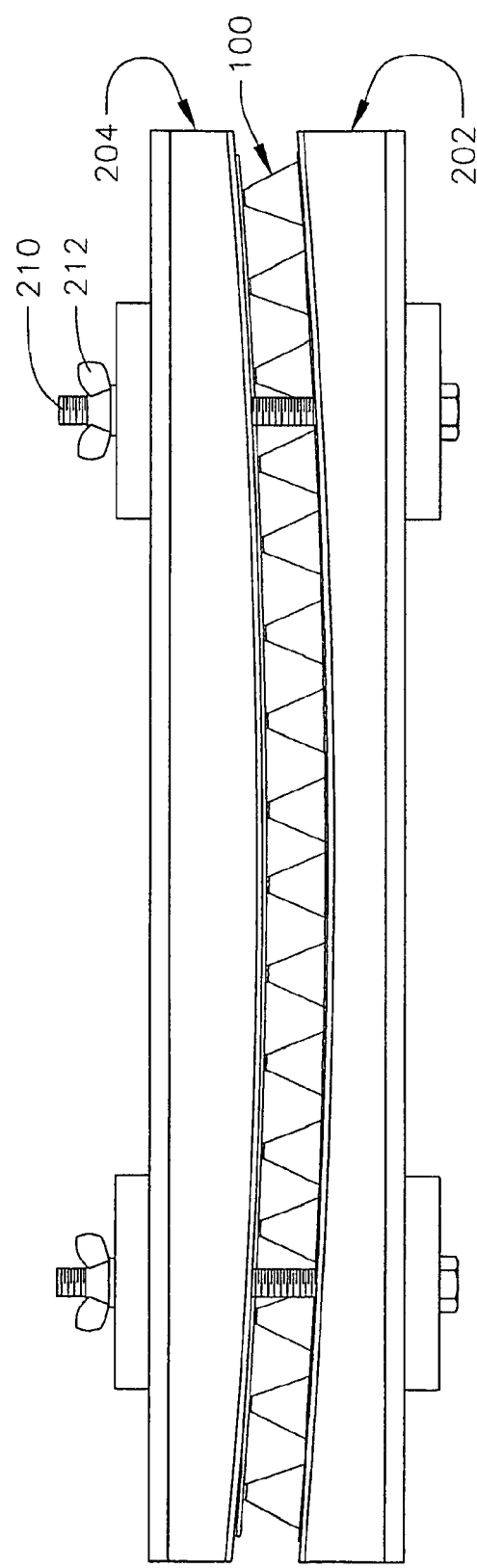
FIG. 27 is a top perspective view of the bonding fixture of FIG. 20, showing a mini-truss thin-sheet panel assembly being shaped therein.

In order to shape an embodiment of a mini-truss thin-sheet panel assembly according to the present invention to have a selected curvature, such as a parabolically cylindrical shape or a portion thereof, any suitable bonding fixture, device, apparatus, or method may be utilized. With reference to FIGS. 20-24, according to one embodiment, a bonding fixture 200 for shaping a mini-truss thin-sheet panel assembly to have a selected curvature includes a first portion 202 (e.g., a lower half) (see FIG. 23) and a second portion 204 (e.g., an upper half) (see FIG. 24). The first portion 202 has a first contoured surface 206 (e.g., a top surface), and the second portion 204 has a second contoured surface 208 (e.g., a bottom surface) that is substantially the same but facing opposite the first contoured surface 206. That is, the first and second contoured surfaces 206, 208 have substantially similar radii of curvature, but one (e.g., the first contoured surface 206) is concave and the other (e.g., the second contoured surface 208) is convex such that the first and second contoured surfaces 206, 208 are substantially equally spaced from one another throughout. Further, the bonding fixture 200 includes fasteners, or a clamp, vice, or any other suitable device or apparatus, for clamping or drawing the first and second portions 202, 204 toward one another with a mini-truss thin-sheet panel assembly (e.g., the mini-truss thin-sheet panel assembly 100) sandwiched therebetween, as shown in FIG. 27. In one embodiment, the bonding fixture 200 includes bolts 210, washers 211, and wing nuts 212 for clamping the first and second portions 202, 204 against the mini-truss thin-sheet panel assembly.

The first portion 202 of the bonding fixture 200, in one embodiment, includes a first panel 216 having the first contoured surface 206 (e.g., an upper surface of the first panel 216). Similarly, the second portion 204 of the bonding fixture 200 includes a second panel 218 having the second contoured surface 208 (e.g., a lower surface of the second panel 218). Also, with further reference to FIG. 22, the first and second portions 202, 204 may include ribs 214 for supporting the first and second panels 216 and 218 and producing the desired curvatures of the first and second contoured surfaces 206, 208.

Figure 25:
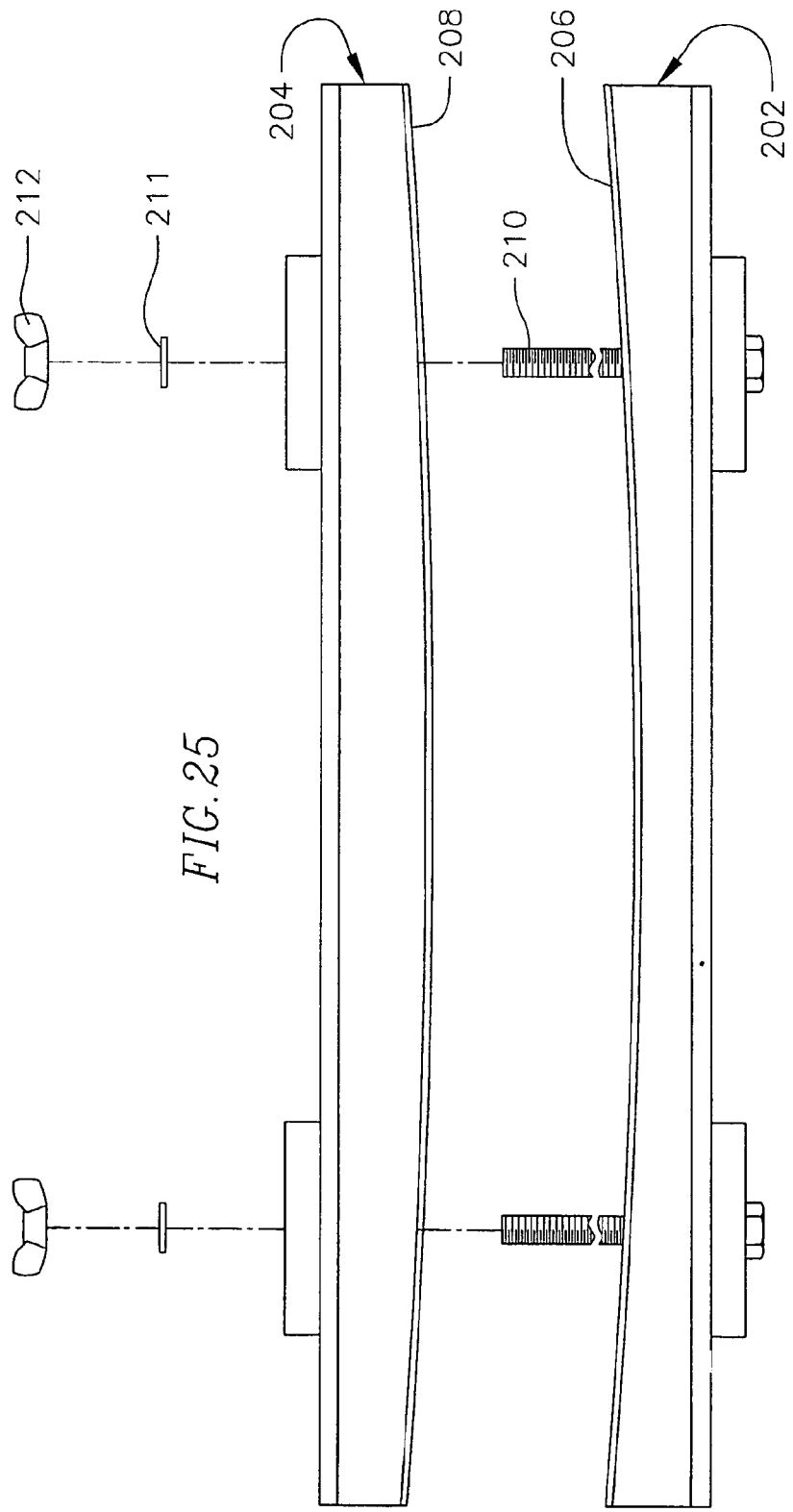
FIG. 25 is a top perspective view of the bonding fixture of FIG. 20 in an open position.
Figure 26:
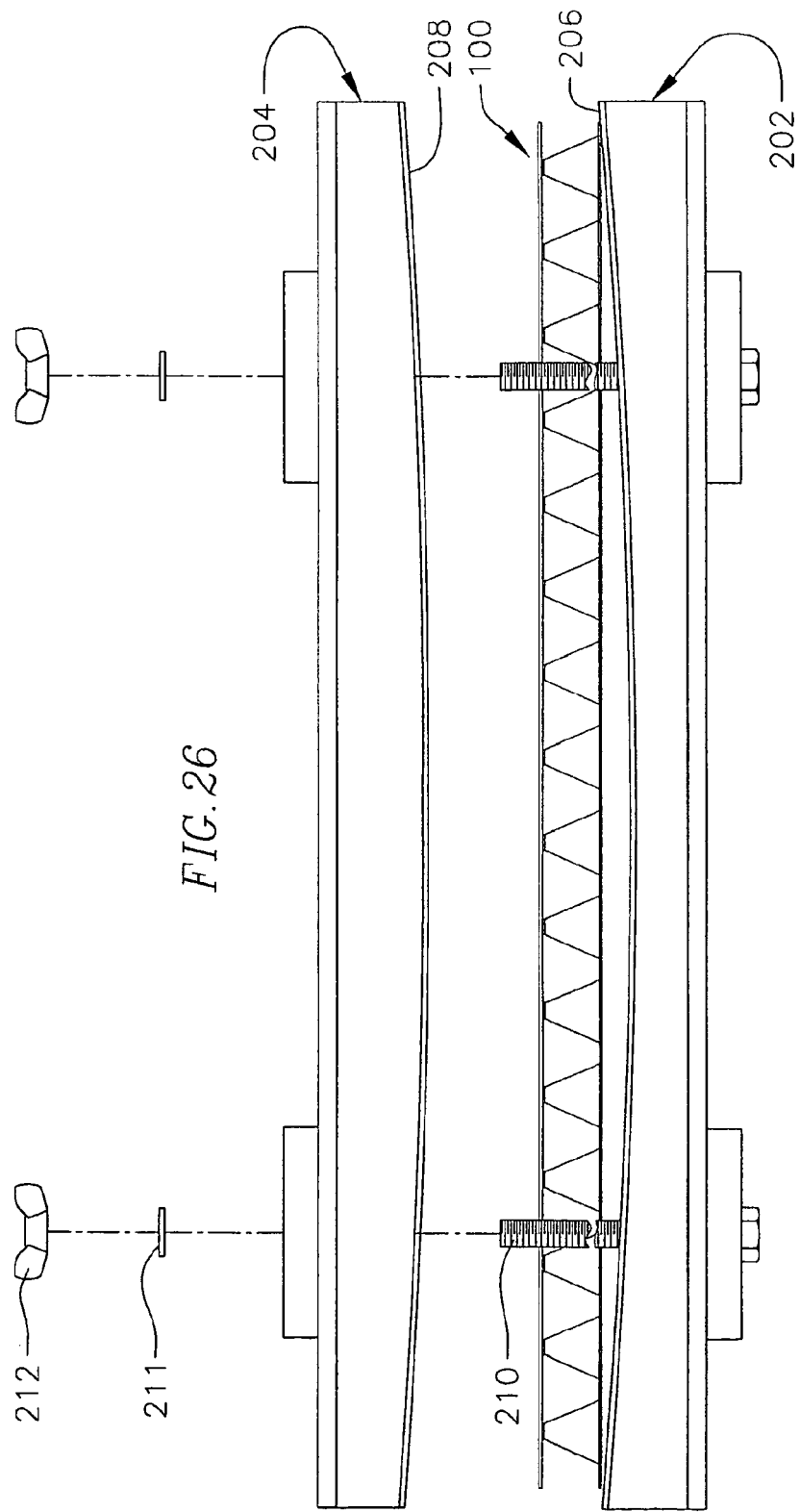
FIG. 26 is a top perspective view of the bonding fixture of FIG. 20, showing a mini-truss thin-sheet panel assembly on a first portion thereof.

Attachment of the thin sheet 110 and the backer 120 to one another, as well as shaping the mini-truss thin-sheet panel assembly 100 to have a selected curvature, may be facilitated utilizing the bonding fixture 200. The first and second contours 206, 208 of the respective first and second portions 202, 204 of the bonding fixture 200, as described above, conform to the geometric shape or curvature that the mini-truss thin-sheet panel assembly 100 is desired to exhibit. The first and second portions 202, 204 of the bonding fixture 200 are separated (see FIG. 25) by loosening the wing nuts 212 from the bolts 210, or by opening any alternative clamping or fastening device. The backer 120 is placed on the first portion 202 of the bonding fixture 200. The adhesive 135, or any other suitable bonding agent, is applied to the adhesive pads 130 of the risers 124. The thin sheet 110 is positioned on the risers 124 of the backer 120. At this stage, the mini-truss thin-sheet panel assembly 100 is not yet shaped to have a selected curvature (see FIG. 26). Alternatively, the adhesive 135 may be applied to the adhesive pads 130 and the thin sheet 110 positioned on the risers 124 of the backer 120 prior to placing the backer 120 on the first portion 202 of the bonding fixture 200.

In order to shape the mini-truss thin-sheet panel assembly 100 to have the selected curvature utilizing the bonding fixture 200 (i.e. the curvature of the first and second contoured surfaces 206, 208) the second portion 204 of the bonding fixture is drawn toward the first portion 202 and tightened against the mini-truss thin-sheet panel assembly 100 by tightening the wing nuts 212 (or by clamping any alternative clamping or tightening device) of the bonding fixture 200 (see FIG. 27). After the bonding is complete and the adhesive 135 is cured, the mini-truss thin-sheet panel assembly 100 retains the curvature or contour of the first and second contoured surfaces 206, 208 of the respective first and second portions 202, 204 of the bonding fixture 200.

Although the drawings and accompanying description illustrate an embodiment of a mini-truss thin-sheet panel assembly as applied to a solar collector trough, it will be apparent that the novel aspects of the mini-truss thin-sheet panel assembly of the invention may also be carried out by utilizing alternative structures, sizes, shapes, and/or materials in embodiments of the mini-truss thin-sheet panel assembly of the present invention. For example, in some embodiments of a mini-truss thin-sheet panel assembly according to the present invention, a thin panel, which has been described above with respect to the mini-truss thin-sheet panel assembly 100 as the thin sheet 110, may not be reflective, but rather, may be formed of an alternative material for purposes of decoration, strength, or otherwise. Embodiments of the mini-truss thin-sheet panel assembly may, for example, be applied to any market sector, such as, but not limited to, solar power generation, science, structural or decorative architecture, and industry.

The preceding description has been presented with reference to various embodiments of the invention. Persons skilled in the art and technology to which this invention pertains will appreciate that alterations and changes in the described structures and methods of operation can be practiced without meaningfully departing from the principles, spirit, and scope of this invention.

What is claimed is:

1. A thin-sheet panel assembly comprising:
a panel comprising a first sheet and a second sheet attached to the first sheet, the panel having a curvature such that the first sheet is substantially under compression and the second sheet is substantially under tension; and
a truss having the curvature and comprising a backer and a plurality of risers formed in one piece with the backer and configured in an array and projecting from the backer, each riser comprising a tab extending transversely from the riser and being attached to the second sheet to maintain the curvature of the panel and the truss.

2. The panel assembly of claim 1, wherein the first sheet comprises glass.

3. The panel assembly of claim 1, wherein the first sheet comprises a reflective material and wherein the curvature of the first sheet is configured such that the first sheet reflects and focuses sunlight.

4. The panel assembly of claim 1, wherein each tab is attached to the second sheet with an adhesive.

5. The panel assembly of claim 1, wherein the second sheet comprises fibers aligned with a plurality of the risers.

6. The panel assembly of claim 1, wherein the second sheet comprises a first plurality of fibers aligned with a first plurality of the risers and a second plurality of fibers transverse to the first plurality of fibers and aligned with a second plurality of the risers.

7. A method of manufacturing a curved thin-sheet panel assembly comprising:
forming a panel comprising attaching a first sheet to a second sheet;
forming a truss comprising a backer and a plurality of risers formed in one piece with the back and configured in an array and projecting from the backer, each riser comprising a tab extending transversely from the riser;
bending the panel to form a curved panel having a curvature such that the first sheet is substantially under compression and the second sheet is substantially under tension;

bending the truss to form a curved truss having the curvature; and attaching the tabs of the risers of the second sheet to maintain the curvature of the panel and the truss.

8. The method of claim 7, wherein the first sheet comprises glass.

9. The method of claim 7, wherein the first sheet comprises a reflective material and wherein the curvature of the first sheet is configured such that the first sheet reflects and focuses sunlight.

10. The method of claim 7, wherein each tab is attached to the second sheet with an adhesive.

11. The method of claim 7, wherein the second sheet comprises fibers aligned with a plurality of the risers.

12. The method of claim 7, wherein the second sheet comprises a first plurality of fibers aligned with a first plurality of the risers and a second plurality of fibers transverse to the first plurality of fibers and aligned with a second plurality of the risers.

13. A method of manufacturing a curved thin-sheet panel assembly comprising:

forming a panel comprising attaching a first sheet to a second sheet;

forming a truss comprising a backer and a plurality of risers by cutting the plurality of risers from the backer sheet and bending the plurality of risers relative to the back sheet with a progressive die;

bending the panel to form a curved panel having a curvature such that the first sheet is substantially under compression and the second sheet is substantially under tension;

bending the truss to form a curved truss having the curvature; and attaching the tabs of the risers of the second sheet to maintain the curvature of the panel and the truss.

14. The method of claim 13, wherein the first sheet comprises glass.

15. The method of claim 13, wherein the first sheet comprises a reflective material and wherein the curvature of the first sheet is configured such that the first sheet reflects and focuses sunlight.

16. The method of claim 13, wherein each tab is attached to the second sheet with an adhesive.

17. The method of claim 13, wherein the second sheet comprises fibers aligned with a plurality of the risers.

18. The method of claim 13, wherein the second sheet comprises a first plurality of fibers aligned with a first plurality of the risers and a second plurality of fibers transverse to the first plurality of fibers and aligned with a second plurality of the risers.

* * * * *